(12) United States Patent
Yeum et al.

(10) Patent No.: US 11,737,226 B2
(45) Date of Patent: *Aug. 22, 2023

(54) WINDOW SUBSTRATE AND DISPLAY DEVICE HAVING THE SAME

(71) Applicant: Samsung Display Co., Ltd., Yongin-si (KR)

(72) Inventors: Jong Hoon Yeum, Yongin-si (KR); Seung Kim, Yongin-si (KR); Hoi Kwan Lee, Yongin-si (KR); Seung Ho Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/210,440

(22) Filed: Mar. 23, 2021

(65) Prior Publication Data

US 2021/0212229 A1  Jul. 8, 2021

Related U.S. Application Data

(63) Continuation of application No. 15/804,274, filed on Nov. 6, 2017, now Pat. No. 10,986,744.

(30) Foreign Application Priority Data

Nov. 7, 2016 (KR) .................. 10-2016-0147526

(51) Int. Cl.
*G06F 1/16* (2006.01)
*H05K 5/03* (2006.01)
(Continued)

(52) U.S. Cl.
CPC ............. *H05K 5/03* (2013.01); *B32B 7/12* (2013.01); *B32B 17/00* (2013.01);
(Continued)

(58) Field of Classification Search
CPC ................. G02F 1/133305; G06F 1/1652
See application file for complete search history.

(56) References Cited

U.S. PATENT DOCUMENTS 3,627,734 A * 12/1971 Ohuchi .................. D01F 6/62
528/289
6,515,729 B1 * 2/2003 Hoshino ............... G02F 1/1345
349/158

(Continued)

FOREIGN PATENT DOCUMENTS

| CN | 104159861 | 11/2014 |
| CN | 104347007 | 2/2015 |

(Continued)

OTHER PUBLICATIONS

Office Action dated May 25, 2021 for Chinese Patent Application No. 201711083048.3.

(Continued)

*Primary Examiner* — Adrian S Wilson
(74) *Attorney, Agent, or Firm* — H.C. Park & Associates, PLC

(57) ABSTRACT

A window substrate for protecting an electronic display device, the window substrate includes: a first substrate; a second substrate; and an interlayer having opposed sides disposed between the first substrate and the second substrate, with one side of the interlayer being in contact with the first substrate, and the other side of the interlayer being in contact with the second substrate, wherein the first substrate has a first thickness, the second substrate has a second thickness, and the interlayer has a third thickness, and wherein the sum of the first thickness, the second thickness, and the third thickness is about 190 μm or less.

15 Claims, 15 Drawing Sheets

(51) Int. Cl.
  *G02F 1/1333* (2006.01)
  *B32B 7/12* (2006.01)
  *B32B 17/00* (2006.01)
  *H05K 5/00* (2006.01)
  *H10K 59/12* (2023.01)
  *H10K 77/10* (2023.01)
  *H10K 102/00* (2023.01)

(52) U.S. Cl.
  CPC ...... *G02F 1/133305* (2013.01); *G06F 1/1652* (2013.01); *H05K 5/0017* (2013.01); *B32B 2307/412* (2013.01); *B32B 2307/536* (2013.01); *B32B 2307/546* (2013.01); *B32B 2307/558* (2013.01); *B32B 2457/206* (2013.01); *G02F 1/133368* (2021.01); *H10K 59/12* (2023.02); *H10K 77/111* (2023.02); *H10K 2102/311* (2023.02); *H10K 2102/351* (2023.02)

(56) References Cited

U.S. PATENT DOCUMENTS

| | | | |
|---|---|---|---|
| 6,608,664 B1* | 8/2003 | Hasegawa | G02F 1/133308 349/60 |
| 9,321,677 B2 | 4/2016 | Chang et al. | |
| 9,321,678 B2 | 4/2016 | Chang et al. | |
| 9,321,679 B2 | 4/2016 | Chang et al. | |
| 9,541,686 B2* | 1/2017 | Hagen | G02B 5/26 |
| 10,078,237 B2* | 9/2018 | Li | G02B 6/0088 |
| 10,809,766 B2 | 10/2020 | Chu et al. | |
| 10,986,744 B2* | 4/2021 | Yeum | H05K 5/0017 |
| 2004/0234778 A1* | 11/2004 | Fukatani | B32B 17/10174 428/441 |
| 2006/0132030 A1 | 6/2006 | Gao et al. | |
| 2007/0047264 A1* | 3/2007 | Joo | G02F 1/133608 362/633 |
| 2007/0053031 A1* | 3/2007 | Matsuura | G02B 5/0242 359/15 |
| 2007/0087134 A1* | 4/2007 | Tyan | C08G 73/1064 428/1.6 |
| 2014/0184577 A1 | 7/2014 | Kim et al. | |
| 2015/0036269 A1 | 2/2015 | Kim et al. | |
| 2015/0210588 A1* | 7/2015 | Chang | B32B 17/06 428/220 |
| 2015/0234208 A1 | 8/2015 | De Ayguavives et al. | |
| 2015/0248142 A1 | 9/2015 | Qian et al. | |
| 2016/0183358 A1* | 6/2016 | Al-Saud | H01L 31/1896 156/701 |
| 2017/0274627 A1* | 9/2017 | Chang | B32B 17/06 |
| 2018/0132371 A1* | 5/2018 | Yeum | H05K 5/0017 |
| 2019/0011954 A1 | 1/2019 | Chu et al. | |
| 2020/0150789 A1 | 5/2020 | Woody, V et al. | |

FOREIGN PATENT DOCUMENTS

| | | |
|---|---|---|
| CN | 105593186 | 5/2016 |
| CN | 105700214 | 6/2016 |
| KR | 10-2015-0130248 | 11/2015 |
| KR | 10-1586241 | 1/2016 |
| KR | 10-1673122 | 11/2016 |
| KR | 10-1677691 | 11/2016 |
| TW | 201532981 | 9/2015 |
| TW | 201615582 | 5/2016 |

OTHER PUBLICATIONS

S. Bouzid et al., "Fracture criterion for glass under impact loading", International Journal of Impact Engineering 25 (2001), pp. 831-845.
Non-Final Office Action dated Apr. 30, 2019, in U.S. Appl. No. 15/804,274.
Non-Final Office Action dated Mar. 27, 2020, in U.S. Appl. No. 15/804,274.
Final Office Action dated Sep. 3, 2020, in U.S. Appl. No. 15/804,274.
Notice of Allowance dated Dec. 23, 2020, in U.S. Appl. No. 15/804,274.

* cited by examiner

WINDOW SUBSTRATE AND DISPLAY DEVICE HAVING THE SAME

CROSS-REFERENCE TO RELATED APPLICATION

This application is a Continuation of U.S. patent application Ser. No. 15/804,274, filed on Nov. 6, 2017, which claims priority from and the benefit of Korean Patent Application No. 10-2016-0147526, filed on Nov. 7, 2016, which is hereby incorporated by reference for all purposes as if fully set forth herein.

BACKGROUND

Field

The invention generally relates to a window substrate, and more particularly, to a flexible window substrate and a display device having the same.

Discussion of the Background

Recently, flexible display devices having flat panel displays have been developed. The flat panel display devices generally include a liquid crystal display (LCD), an organic light emitting diode (OLED), an electrophoretic display (EPD), and the like.

Since flexible display devices have bending and folding characteristics, the flexible display devices can be folded or rolled. Accordingly, the flexible display devices having large screens can be conveniently carried. The flexible display devices can be applied in various fields including not only mobile devices such as mobile phones, portable multimedia players (PMPs), navigations, ultra mobile PCs (UMPCs), electronic books, and electronic newspapers, but also TVs, monitors, and the like.

Defects may occur in the flexible display devices when an external shock force is applied, including defects affecting display quality or resolution. In this case, to avoid deterioration of display quality, flexible display devices should be resistant to external shock. With the advent of the flexible display devices, the materials used to protect them from external shocks have become thinner.

The above information disclosed in this Background section is only for enhancement of understanding of the background of the inventive concepts, and, therefore, it may contain information that does not form the prior art that is already known in this country to a person of ordinary skill in the art.

SUMMARY

Window substrates constructed according to the principles of the invention are capable of protecting the display devices from an external shock and/or preventing the display devices damaged even when they are folded multiple times while maintaining their flexible characteristics. For example, Applicant discovered that a window substrate having at least two glass substrates, with each substrate having a predetermined thickness to provide a compressive stress profile, and an interlayer disposed between the glass substrates can provide excellent resistance to external shock while also preventing damage caused by folding the display multiple times.

Embodiments also provide a display device having a window substrate constructed according to the principles of the invention.

Additional aspects will be set forth in the detailed description which follows, and, in part, will be apparent from the disclosure, or may be learned by practice of the inventive concepts.

According to one aspect of the invention, a window substrate for protecting an electronic display device includes: a first glass substrate having a first thickness; a second glass substrate having a second thickness; and an interlayer disposed between the first glass substrate and the second glass substrate, the interlayer having a third thickness, wherein the sum of the first thickness, the second thickness, and the third thicknesses is about 190 μm or less.

Each of the first thickness and the second thickness may be about 50 μm or less.

The electronic display device may be a flexible display and when the window substrate is bent such that the first glass substrate is disposed toward the outside of the flexible display device and the second glass substrate is disposed toward the inside of the flexible display device, the first thickness may be smaller than the second thickness. The first thickness may be about 40 μm or less, and the second thickness may be about 50 μm or less.

The third thickness may be about 100 μm or less. Alternatively, the third thickness may be about 10 μm to about 30 μm.

The interlayer may include an optically clear adhesive.

The window substrate may have an impact resistance such that the window substrate is not damaged when a pen of 5.8 g is vertically dropped from a first height onto one surface of the window substrate, and wherein the first height may be about 4 cm or more.

At least one of the first and second glass substrates may include a first region extending from one surface thereof to a first depth at which an ion exchange process occurs, and having a first compressive stress. The first depth may be about 1 μm or more, and the first compressive stress may be about 600 MPa to about 1200 MPa.

The window substrate may have a light transmittance of about 90% or more.

A yellow index variation of the window substrate may be about 2.0 or less when the window substrate is exposed to UVB light having a wavelength of 280 nm to 360 nm for 72 hours.

An absorption load when an iron ball of 5.5 g is freely dropped on one surface of the window substrate may be 5% or more of an impact load of the iron ball.

The window substrate may further include a cover layer disposed on the first glass substrate or the second glass substrate.

The cover layer may include at least one of an anti-reflection layer, an anti-stain layer, or an anti-fingerprint layer.

At least a portion of the window substrate may have flexibility.

The window substrate may be used in a display device together with a display panel. More specifically, and according to another aspect of the invention, a display device includes: a display panel configured to display an image on a front surface thereof, and the window substrate is disposed on the front surface of the display panel. The window substrate may include a first glass substrate having a first thickness; a second glass substrate having a second thickness; and an interlayer disposed between the first glass substrate and the second glass substrate, the interlayer having a third thickness, wherein the sum of the first thickness, the second thickness, and the third thickness is about 190 µm or less.

When the window substrate is bendable into a position such that the first glass substrate is disposed toward the outside of the display device and the second glass substrate is disposed toward the inside of the display device, the first thickness may be smaller than the second thickness. One surface of the display panel may be in contact with one surface of the second substrate.

According to another aspect of the invention, a window substrate for protecting an electronic display device, the window substrate includes: a first substrate; a second substrate; and an interlayer having opposed sides disposed between the first substrate and the second substrate, with one side of the interlayer being in contact with the first substrate, and the other side of the interlayer being in contact with the second substrate, wherein the first substrate has a first thickness, the second substrate has a second thickness, and the interlayer has a third thickness, and wherein the sum of the first thickness, the second thickness, and the third thickness is about 190 µm or less.

The electronic display device may be a flexible display device and when the window substrate may be bent such that the first substrate may be disposed toward the outside of the flexible display device and the second substrate may be disposed toward the inside of the flexible display device, the first thickness may be smaller than the second thickness.

The first thickness may be about 40 µm or less, and the second thickness may be about 50 µm or less.

The third thickness may be about 100 µm or less.

The third thickness may be about 10 µm to about 30 µm.

The interlayer may include an optically clear adhesive.

The window substrate may have an impact resistance such that the window substrate may be not damaged when a pen of about 5.8 g is vertically dropped from a first height onto one surface of the window substrate, and wherein the first height may be about 4 cm or more.

At least one of the first and second substrates may include a first region extending from one surface thereof to a first depth at which an ion exchange process occurs, and having a first compressive stress.

The first depth may be about 1 µm or more, and the first compressive stress may be about 600 MPa to about 1200 MPa.

The window substrate may have a light transmittance of about 90% or more.

A yellow index variation of the window substrate may be about 2.0 or less when the window substrate may be exposed to UVB light having a wavelength of 280 nm to 360 nm for about 72 hours.

An absorption load when an iron ball of about 5.5 g is freely dropped on one surface of the window substrate may be about 5% or more of an impact load of the iron ball.

The window substrate may further include a cover layer disposed on the first substrate or the second substrate.

The cover layer may include at least one of an anti-reflection layer, an anti-stain layer, or an anti-fingerprint layer.

At least a portion of the window substrate may have flexibility.

The window substrate may be bendable at a radius of curvature of about 1 mm to about 10 mm.

Each of the first thickness and the second thickness may be greater than the third thickness.

According to still another aspect of the invention, a display device includes: a display panel to display an image on a front surface thereof; and a window substrate disposed on the front surface of the display panel, wherein the window substrate includes: a first substrate; a second substrate; and an interlayer having opposed sides disposed between the first substrate and the second substrate, with one side of the interlayer being in contact with the first substrate, and the other side of the interlayer being in contact with the second substrate, wherein the first substrate has a first thickness, the second substrate has a second thickness, and the interlayer has a third thickness, and wherein the sum of the first thickness, the second thickness, and the third thickness is about 190 µm or less.

The foregoing general description and the following detailed description are illustrative and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate embodiments of the inventive concepts, and, together with the description, serve to explain principles of the inventive concepts.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION OF THE ILLUSTRATED EMBODIMENTS

Figure 1A:
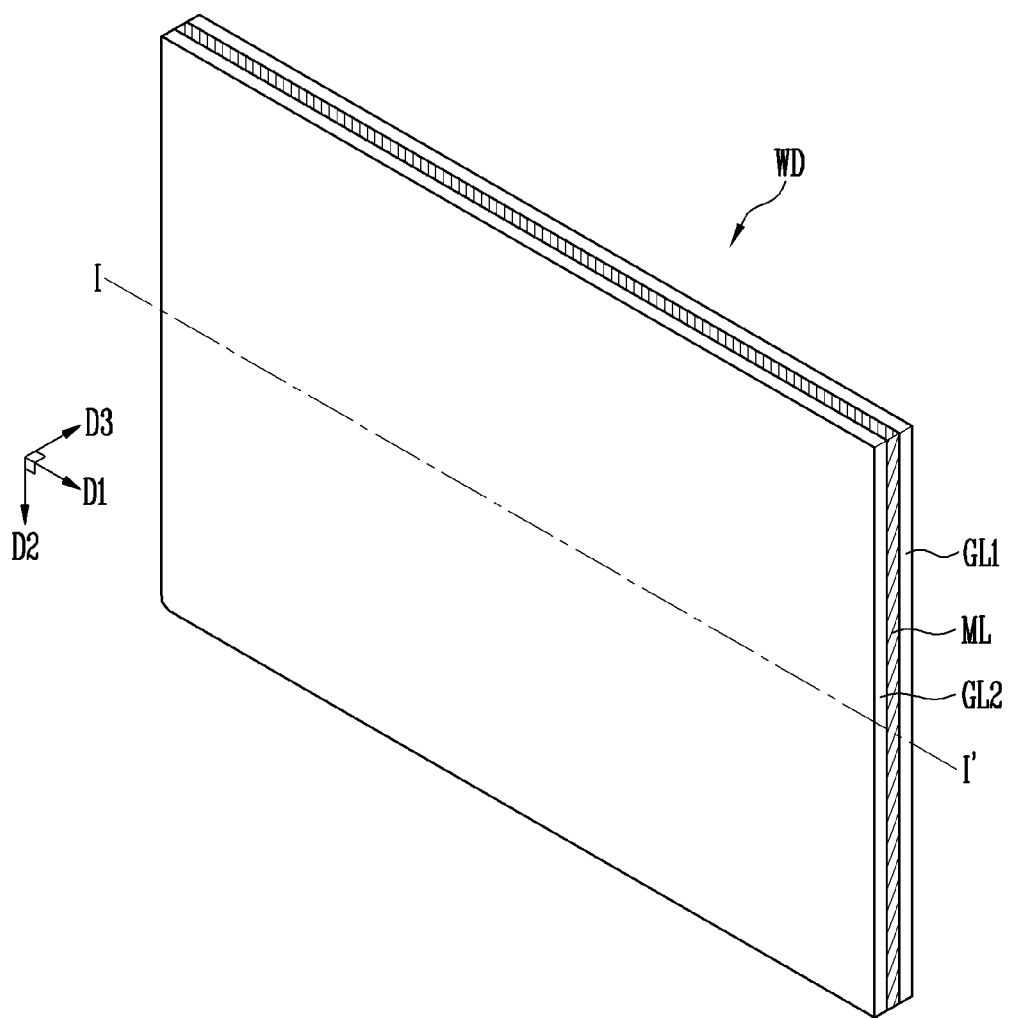
FIG. 1A is a perspective view illustrating a first embodiment of a window substrate constructed according to the principles of the invention.

In the following description, for the purposes of explanation, numerous specific details are set forth in order to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various embodiments are described herein with reference to sectional illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

One or more embodiments relate to a window substrate including a glass substrate. The window substrate can be employed in a display device. Particularly, the window substrate can be used as a window panel located on a front surface of a display panel. Accordingly, in one or more embodiments, the window panel is referred to as a window substrate. However, the use of the window substrate constructed according to the principles of the invention is not limited thereto, and the window substrate may be used in any other application requiring a transparent insulating substrate. For example, the window substrate may be used as a base substrate on which elements are mounted in the display device or a counter substrate opposite to the base substrate. In addition, the window substrate may be used as a substrate of a touch screen panel disposed on a display substrate.

Figure 1B:
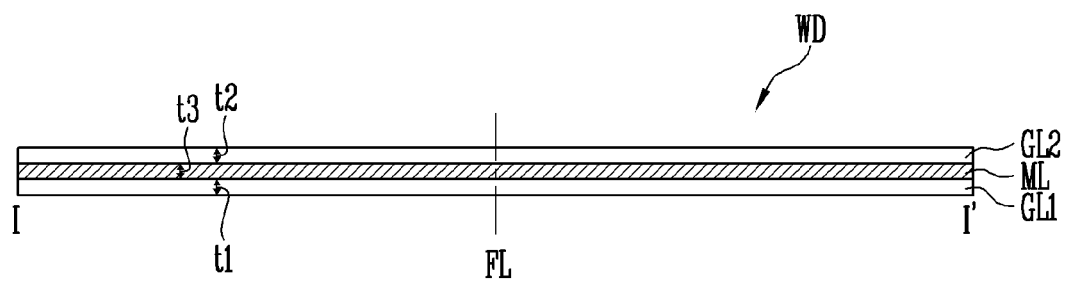
FIG. 1B is a cross-sectional view of the window substrate of FIG. 1A in an unfolded position taken along line I-I' of FIG. 1A.
Figure 1C:
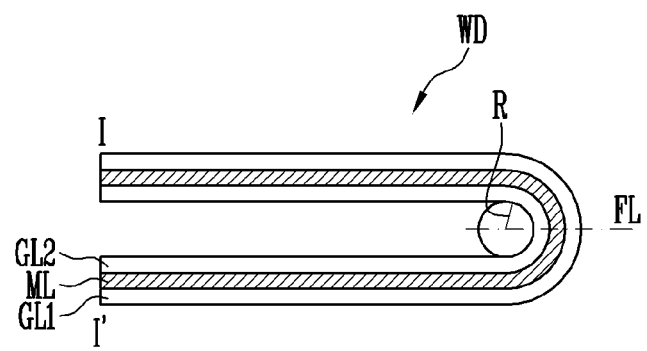
FIG. 1C is a cross-sectional view of the window substrate of FIG. 1A in a folded position taken along line I-I' of FIG. 1A.

FIG. 1A is a perspective view illustrating a first embodiment of a window substrate constructed according to the principles of the invention. FIG. 1B is a cross-sectional view of the window substrate of FIG. 1A in an unfolded position taken along line I-I' of FIG. 1A. FIG. 1C is a cross-sectional view of the window substrate of FIG. 1A in a folded position taken along line I-I' of FIG. 1A Referring to FIGS. 1A to 1C, the window substrate WD according to the illustrated embodiment is shown as having a rectangular, plate shape, but any other shape known in the art may be used as well.

In particular, for convenience of description, it has been assumed that the planar shape of the window substrate WD when viewed in plan is a rectangular shape having a pair of long sides and a pair of short sides. In addition, it has been illustrated that the long sides extend longitudinally in a first direction D1, and the short sides extend in a second direction D2 orthogonal to the first direction D1, and the third direction D3 is perpendicular to the both the first and second directions D1 and D2. However, the shape of the window substrate WD is not limited thereto, but the window substrate WD may have various shapes. For example, the window substrate WD may be provided in various shapes such as a closed-shape polygon including linear sides, a circle, an ellipse, etc., including curved sides, and a semicircle, a semi-ellipse, etc., including linear and curved sides. In one embodiment, when the window substrate WD has linear sides, at least one portion of corners of each of the shapes may be formed in a curve. For example, when the window substrate WD has a rectangular shape, a portion at which adjacent linear sides meet each other may be replaced with a curve having a predetermined curvature. That is, a vertex portion of the rectangular shape may be formed with a curved side having both adjacent ends respectively connected to two adjacent linear sides, the curved side having a predetermined curvature. The curvature may be differently defined depending on position. For example, the curvature may be changed depending on the position at which the curve is started, a length of the curve, etc.

The window substrate WD includes a first glass substrate GL1, a second glass substrate GL2, and an interlayer ML between the first glass substrate GL1 and the second glass substrate GL2.

Each of the first glass substrate GL1 and the second glass substrate GL2 is provided in a plate shape having opposed surfaces. Each of the first glass substrate GL1 and the second glass substrate GL2 may be made of a glass material including silicate. In one or more embodiments, various materials may be further added to the glass material to provide for excellent durability, surface smoothness, and transparency. For example, the glass substrate may be made of a material including aluminosilicate, borosilicate, boroaluminosilicate, etc. In one or more embodiments, the glass substrate may further include alkali metal or alkali earth metal and oxide thereof.

In one or more embodiments, the material of the first and second glass substrates GL1 and GL2 is not limited to the above-described compositions, and the first and second glass substrates GL1 and GL2 may be modified using various other materials and various ratios thereof known in the art.

The interlayer ML allows the first glass substrate GL1 and the second glass substrate GL2 to be attached to each other. Also, the interlayer ML distributes stresses generated in the first glass substrate GL1 and the second glass substrate GL2. In other words, when an impact is applied to a portion of the first glass substrate GL1 and/or the second glass substrate GL2, the interlayer ML offsets a tensile stress generated in the glass substrate due to the impact to prevent the glass substrate from being broken, and absorbs impact energy generated when the glass substrate is broken to prevent minute glass fragments from being scattered. To this end, the interlayer ML may have an elastic material to absorb impact energy, and have a flexible material that is curvable or foldable.

The interlayer ML may be made of an optically clear glue or adhesive. The material constituting the interlayer may include an acrylic polymer, an ethylene vinyl acetate polymer, a nitrile polymer, a silicone rubber, a butyl rubber, a styrene block copolymer, a vinyl ether polymer, a urethane polymer, an epoxy polymer, and the like. For example, the interlayer ML may be made of a urethane polymer, or may be made of the urethane polymer to which a rubber or acrylic polymer is added. However, the material constituting the interlayer ML is not limited thereto, and may include various adhesive materials known in the art.

In one or more embodiments, the window substrate may have flexibility and accordingly can be curved, folded, or rolled. In one or more embodiments, the window substrate may be folded or rolled in the third direction D3 or the direction opposite to the third direction D3. That is, the window substrate may be folded in a direction in which a portion of the outer surface of the second glass substrate GL2 faces the rest of the outer surface of the second glass substrate GL2. The term "folded" or "bended" does not mean a fixed shape but means a shape deformable into another shape from the original shape, and includes a folded, bent, curved, or rolled shape, such as a roll along one or more specific lines.

In one or more embodiments, the first glass substrate GL1, the second glass substrate GL2, and the interlayer ML may have a total thickness of about 190 μm or less. That is, if a distance between the opposed surfaces of the first glass substrate GL1 is a first thickness t1, a distance between the opposed surfaces of the second glass substrate GL2 is a second thickness t2, and a thickness of the interlayer ML between the first glass substrate GL1 and the second glass substrate GL2 is a third thickness t3, the sum of the first to third thicknesses t1 to t3 may be about 190 μm or less. Applicants have discovered that the total maximum thickness of about 190 μm is particularly advantageous. When the window substrate has a thickness of over 190 μm, the repulsive force of the window substrate against deformation is excessively increased, and therefore, the bending of the window substrate is difficult.

In one or more embodiments, the first glass substrate GL1, the second glass substrate GL2, and the interlayer ML may have a total thickness of about 50 μm or more. That is, the sum of the first to third thicknesses t1 to t3 may be about 50 μm or more. When the thickness of the window substrate WD is less than 50 μm, the rigidity of the window substrate WD is low, and therefore, the window substrate WD may be damaged in processing. However, it is preferable to make the thickness of the window substrate WD as thin as possible, and therefore, the window substrate WD may be fabricated to have a thickness of less than about 50 μm within a limit that satisfies rigidity and processing ability. That the window substrate WD has been damaged means a state in which the window substrate WD cannot be used for an intended purpose, such as a state in which the window substrate WD is broken, a state in which a flaw or crack is generated in the window substrate WD, a state in which the flaw or crack is propagated, or a state in which the window substrate WD is ruptured.

In detail, the first thickness t1 of the first glass substrate GL1 may be about 10 µm to about 50 µm, and the second thickness t2 of the second glass substrate GL2 may be about 10 µm to about 50 µm. In addition, the third thickness t3 of the interlayer ML may be about 10 µm to about 100 µm. In another embodiment of the invention, the first thickness t1 may be about 30 µm to about 50 µm, and the second thickness t2 may be about 30 µm to about 50 µm. In addition, the third thickness t3 may be about 10 µm to about 30 µm.

Consequently, the window substrate WD constructed according to the principles of the invention is bendable with a relatively small radius of curvature R. Hence, the window substrate WD may have a radius of curvature R of about 1 mm to about 10 mm or about 1 mm to about 5 mm.

In one or more embodiments, the thicknesses of the first glass substrate GL1 and the second glass substrate GL2 may be equal to each other, or may be different from each other. Particularly, when the window substrate WD is folded such that, based on any one surface of the window substrate WD, a portion of the surface and the rest of the surface face each other, the thicknesses of the first glass substrate GL1 and the second glass substrate GL2 may be different so as to minimize stresses applied to the first and second glass substrates GL1 and GL2.

For example, when a reference line about which the window substrate WD is folded is denoted as a folding line FL, the folding line FL may be located at a surface of the second glass substrate GL2 of the window substrate WD. The window substrate WD may be folded, about the folding line FL, such that a portion of the surface of the second glass substrate GL2 and the rest of the surface of the second glass substrate GL2 face each other. In this case, the inside of the second glass substrate GL2 is disposed at the outside of the first glass substrate GL1, one surface of the first glass substrate GL1 becomes an outer circumferential surface, and one surface of the second glass substrate GL2 becomes an inner circumferential surface. When the window substrate WD is bent, the first thickness t1 of the first glass substrate GL1 at the outside of the window substrate WD may have a smaller value than the second thickness t2 of the second glass substrate GL2 disposed at the inside. In an embodiment, the first thickness t1 may be about 20 µm to about 40 µm, and the second thickness t2 may be 30 µm to about 50 µm.

As described above, the window substrate WD includes two glass substrates having a small thickness of 50 µm or less. Hence, when an object having a narrow cross sectional area, such as a pen, collides with the window substrate, bending breakage may occur as the glass substrate is broken by stress applied to the glass substrate. In order to reduce the bending breakage, the impact resistance of the glass substrate must be improved. To this end, the glass substrate constructed according to the principles of the invention may be a glass chemically reinforced by an ion exchange process so as to improve the impact resistance thereof. In one or more embodiments, the term "ion exchange process" means that the glass exchanges a positive ion of the same atomic value with a positive ion located on or near the surface of the glass. For example, the ion exchange process may mean that a positive ion (e.g., a positive ion of an alkali metal such as $Na^+$ or $Li^+$) inside the glass is exchanged with another positive ion from the outside. The ion exchange process may be used to increase the compressive stress profile of the glass to a specific depth extending from both surfaces of the glass. When such a compressive stress profile is provided in the glass substrate, a high strength is provided against bending of the glass substrate as long as the flaw exists within a region defined by a reference line where the compressive stress is above 0 in a compressive stress graph. Here, the defined region may be a region between the surface of the glass and a specific depth from the surface. Accordingly, chemical reinforcement of both surfaces of the glass may be achieved by the ion exchange process.

Figure 2A:
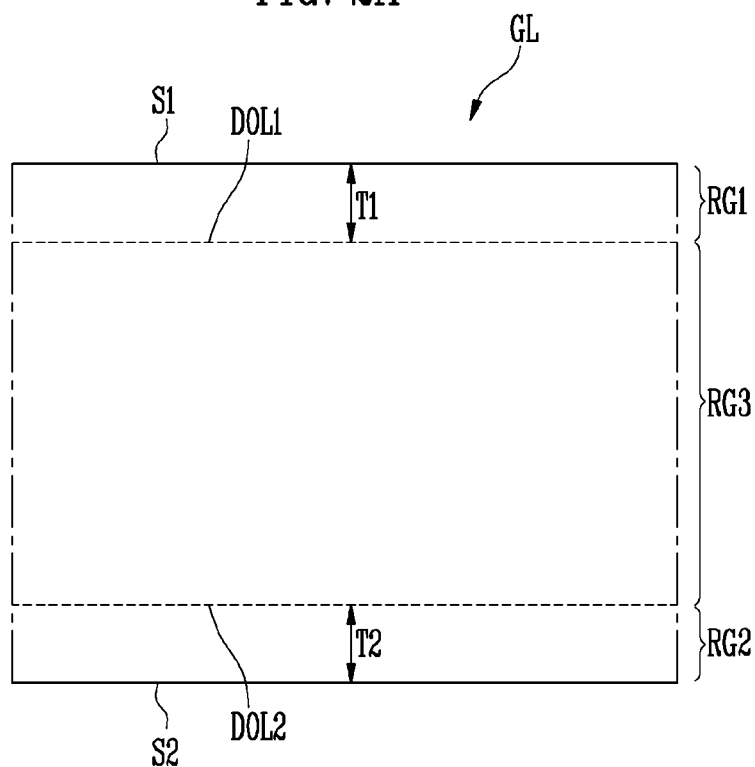
FIG. 2A is a schematic, cross-sectional view of a first or second glass substrate in the window substrate according to one or more embodiments.
Figure 2B:
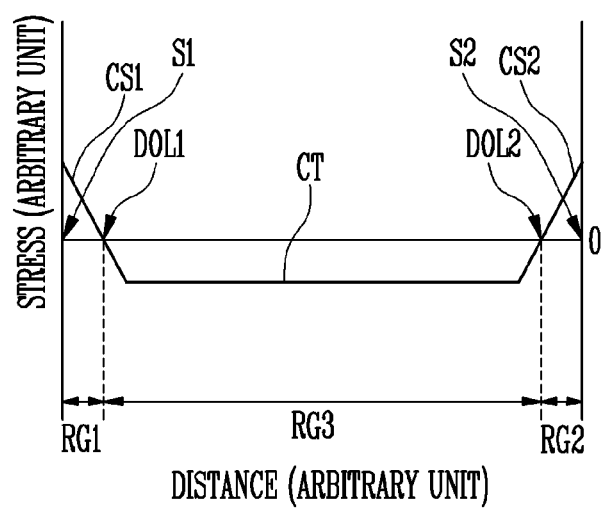
FIG. 2B is a graph illustrating stress versus distance from a surface of the glass substrate of FIG. 2A.

FIG. 2A is schematic, cross-sectional view of a first or second glass substrate GL1 or GL2 in the window substrate according to one or more embodiments. FIG. 2B is a graph illustrating stress versus distance from a surface of the glass substrate of FIG. 2A. The first glass substrate GL1 and the second glass substrate GL2 have the substantially same shape except their thicknesses. Therefore, hereinafter, the first glass substrate GL1 and the second glass substrate GL2 are commonly called as a glass substrate.

Referring to FIGS. 2A and 2B, the glass substrate includes a first region RG1 extending to a first depth DOL1 from one surface (hereinafter, referred to as a first surface S1) thereof, a second region RG2 extending to a second depth DOL2 from the other surface (hereinafter, referred to as a second surface S2) thereof, and a third region RG3 located between the first region RG1 and the second region RG2.

In the first region RG1, the first depth DOL1 is a depth at which a positive ion inside the glass substrate is exchanged with a positive ion from the outside. Accordingly, the first region RG1 has a first thickness T1. A first compressive stress CS1 is applied to the first region RG1 by the ion exchange. The first compressive stress CS1 decreases from the first surface S1 to the first depth DOL1 according to a predetermined function, and becomes 0 at the first depth DOL1. Here, the entire compressive stress stored in the first region RG1 may be represented by the area under a specific function in the depth direction of layers from the first surface S1.

The first region RG1 can offset a tensile stress generated in the glass substrate while the glass substrate is being folded, particularly, a tensile stress reaching a maximum value in the vicinity of the first surface S1.

In the second region RG2, the second depth DOL2 is a depth at which a positive ion inside the glass substrate is exchanged with a positive ion from the outside. Accordingly, the second region RG2 has a second thickness T2. A second compressive stress CS2 is applied to the second region RG2 by the ion exchange. The second compressive stress CS2 decreases from the second surface S2 to the second depth DOL2 according to a predetermined function, and becomes 0 at the second depth DOL2. The entire compressive stress stored in the second region RG2 may also be represented by the area under a specific function in the depth direction of layers from the second surface S2.

The second region RG2 can offset a tensile stress generated in the glass substrate GL while the glass substrate GL is being folded, particularly, a tensile stress reaching a maximum value in the vicinity of the second surface S2.

The functions related to the above-described compressive stresses may be changed depending on the type of the glass substrate, the type of the ion-exchanged ion, condition(s) in the ion exchange, or the like, but may decrease in the direction from the first surface S1 to the third region RG3 and in the direction from the second surface S2 to the third region RG3. In this illustrated embodiment, the two functions have been shown in the form of straight lines for convenience of illustration. However, the increase or decrease of the functions is not limited thereto, and the function value to the first depth DOL1 or to the second depth DOL2 may be variously changed. For example, the function value may be constant, may decrease and then increase, or may increase and then decrease.

In one or more embodiments, the first depth DOL1 and/or the second depth DOL2 may be different depending on the thickness of the glass substrate. For example, the first depth DOL1 and/or the second depth DOL2 may be provided to be equal to or less than ⅓ or ¼ of the thickness of the glass substrate.

If it is assumed that the positive ion from the outside is a first ion and the positive ion inside the glass substrate is a second ion, the first ion may be $K^+$ and the second ion may be $Na^+$ or $Li^+$.

The first compressive stress CS1 and the second compressive stress CS2 are balanced by a central tension CT stored in the third region RG3. The central tension CT is a tensile stress.

In one or more embodiments, the first depth DOL1 is the substantially same as the second depth DOL2. In addition, the first compressive stress CS1 at the first surface S1 of the glass substrate is the substantially same as the second compressive stress CS2 at the second surface S2 of the glass substrate. As a result, the compressive stresses at both the surfaces of the glass substrate are symmetrical to each other.

When the glass substrate is folded or rolled, a compressive stress is applied to the surface corresponding to an inner circumferential surface, and a tensile stress is applied to the surface corresponding to an outer circumferential surface.

In one or more embodiments, in the glass substrate, each of the first depth DOL1 and the second depth DOL2 may be about 1 μm to about 15 μm. In another embodiment of the glass substrate, each of the first depth DOL1 and the second depth DOL2 may be about 6 μm to about 10 μm.

Also, each of the first compressive stress CS1 and the second compressive stress CS2 in the glass substrate, applied by the chemical reinforcement, may be from about 600 MPa to about 1200 MPa. The chemical reinforcement may be achieved by the ion exchange process. In another embodiment, each of the first compressive stress CS1 and the second compressive stress CS2, applied by the chemical reinforcement, may be about 730 MPa to about 850 MPa. Here, the first compressive stress CS1 may be the entire compressive stress stored in the first region RG1, and the second compressive stress CS2 may be the entire compressive stress stored in the second region RG2.

When a flaw is generated in at least one of the opposed surfaces of the glass substrate, if the flaw exists within a region defined by a reference line where the compressive stress is 0 and a positive compressive stress value, the tensile strength is compensated by the compressive strength. In this case, the glass substrate GL is not broken, and the damage caused by the flaw is prevented. When the first depth DOL1 and the second depth DOL2 are out of the above-described range, that is, when the flaw does not exist within the above-described region and/or when the first compressive stress CS1 and the second compressive stress CS2 are out of the above-described range, it is difficult to sufficiently compensate for the tensile stress applied to the glass substrate.

In one or more embodiments, the chemical reinforcement may be symmetrically performed on the two opposed surfaces of the glass substrate. However, the inventive concepts are not limited thereto, and the chemical reinforcement may be asymmetrically performed. Particularly, when the glass substrate is mainly folded in a specific direction, the chemical reinforcement for compensating for the stresses may also be asymmetrically performed.

In another embodiment, chemical reinforcement may be performed on each of the two glass substrates constituting the window substrate WD to the same degree or different degrees. For example, the first glass substrate GL1 and the second glass substrate GL2 may be chemically reinforced to have compressive stresses equal to each other. However, the inventive concepts are not limited thereto, and the first glass substrate GL1 and the second glass substrate GL2 may be chemically reinforced to have compressive stresses different from each other. In one or more embodiments the second glass substrate GL2 may be chemically reinforced to have a compressive stress greater than that of the first glass substrate GL1. Therefore, the second glass substrate GL2 may have a greater depth than the first glass substrate GL1.

As described above, the damage of the glass substrate, i.e., the first glass substrate GL1 and the second glass substrate GL2 is minimized even in a case where a flaw is generated in the surface to which the tensile stress is applied when the glass substrate is folded or rolled. Particularly, although the first and second glass substrates GL1 and GL2 are ultra-thin substrates having a thickness of 50 μm or less, the generation or growth of a flaw due to the tensile stress when the first and second glass substrates GL1 and GL2 are folded or rolled can be decreased. Accordingly, the possibility of damage of the entire window substrate can be surprisingly decreased.

The light transmittance of the window substrate WD having the above-described structure may be about 90% or more. Light emitted from pixels of a display panel which will be described later may be viewed by a user through the window substrate WD. Also, the light emitted from the pixels may pass through the window substrate WD. The window substrate has a sufficient light transmittance, so that the luminance of light emitted from the display panel can be prevent from being lowered.

In one or more embodiments, the window substrate WD may have a yellow index variation ($\Delta Y1$) of 2.0 or less even when the window substrate is exposed to UVB light having a wavelength of 280 nm to 360 nm for 72 hours. When the window substrate WD is applied to another device such as a display device, the window substrate WD may be exposed to direct light including UV. However, any color variation does not occur in the window substrate WD under such a condition. The window substrate WD constructed according to the principles of the invention satisfies this condition.

In one or more embodiments, the window substrate WD may have a haze value of 1.5% or less. In one or more embodiments the window substrate may have a pencil hardness of 8 H to 9 H.

In one or more embodiments, as the window substrate WD includes the first glass substrate GL1, the second glass substrate GL2, and the interlayer ML provided between the first and second glass substrates GL1 and GL2, the window substrate WD can have an impact resistance. Particularly, bending deformation due to a point impact and compressive deformation and/or tensile deformation due to a surface impact are reduced.

The bending deformation due to the point impact may be checked through a pen drop impact resistance test. In one or more embodiments, an impact resistance against a point impact was evaluated in such a manner that checks whether the window substrate is damaged by allowing a specific pen (Fine BIC pen produced by Societe BIC) having a weight of about 5.8 g, which is covered with a lid, to freely drop, according to gravity, in a state in which the specific pen is perpendicular to a surface of the window substrate. In one or more embodiments, the window substrate may have an impact resistance of at least about 4 cm. That is, when the pen having the weight of about 5.8 g drops toward the window substrate at a height of about 4 cm or less, the window substrate may not be broken.

One surface of the window substrate is frequently in contact with a sharp tool such as a stylus pen. The impact of a front surface, caused by the tool, has a relatively narrow contact area with the window substrate, and accordingly corresponds to a point impact where a high pressure is applied to a narrow area of the window substrate when the tool drops from the top. As a result, bending deformation occurs as the window substrate is bent at the position at which the impact is applied. Therefore, the bending deformation causes damage of the window substrate or causes a bright spot failure of the display panel. However, a window substrate constructed according to the principles of the invention has a sufficient impact resistance against the point impact, and thus the above-described damage or failure can be prevented.

The compressive deformation and/or tensile deformation due to the surface impact may be checked through an impact resistance test.

In general, a stress applied to a glass substrate may be indicated by application load (N)/unit area (m$^2$). When a tool such as a ball applies an impact to the glass substrate, the durability against impact is improved as the area in which the ball is applied to the glass substrate increases when the ball is in contact with the glass substrate. In an embodiment, first and second glass substrates are provided, and an interlayer is provided between the first and second glass substrates, so that, although a tool such as a ball applies an impact to one of the two substrates, the volume at a point at which an accumulated stress forms and grows a defect such as a crack increases, thereby improving impact resistance (Fracture criterion for glass under impact loading, S. Bouzid et al., International Journal of Impact Engineering 25 (2001) 831-845).

In one or more embodiments, the impact resistance against surface impact was evaluated in such a manner that measures how much impact load the window substrate absorbs by allowing an iron ball having a diameter of 25.4 mm and a mass of 5.5 g to freely drop under gravity at a height of 5 cm from a surface of the window substrate. The window substrate according to the embodiment can absorb at least about 5% of the impact load.

The window substrate is frequently in contact with a tool having a relatively wide contact area, in addition to the sharp tool such as the stylus pen. As the window substrate is compressed at an impact position by a surface impact applied by the tool and stretched in the vicinity of the impact position, compressive deformation and tensile deformation occur. The compressive deformation and tensile deformation may also cause damage of the window substrate and a bright spot failure of the display panel. However, a window substrate constructed according to the principles of the invention has a sufficient impact resistance against the surface impact, and thus the above-described damage or failure can be prevented.

In one or more embodiments, the window substrate may have a folding reliability of 200,000 times. The folding reliability means that the window substrate is not damaged even when it is folded multiple times. A folding reliability may be performed in a plurality of cycles, using a Clamshell folding reliability test. The Clamshell folding reliability test may be performed in a form in which a step of allowing both end portions of the window substrate to face each other and then stretching the window substrate to be in a flat state is used as a cycle, thereby repeating the cycle. In an embodiment, when the window substrate is applied to another device, e.g., a display device, the window substrate may be folded multiple times. Therefore, the folding reliability test is performed as a test for ensuring reliability when the window substrate is folded multiple times. In the folding reliability test, the window substrate was attached to an optically clear adhesive and then placed on a test plate. The test plate includes a stationary plate and a rotatable plate rotatable between the stationary plate and a single- or multi-shaft folding gear. In the folding reliability test, the glass substrate is maintained flat for a predetermined time (e.g., about one second) by disposing the window substrate on the stationary plate and the rotatable plate, which are placed on the same plane, and the rotatable plate is moved to be parallel to the stationary plate in a state in which the rotatable plate is spaced apart from the stationary plate. Accordingly, the window substrate is in a state in which it is folded between the two plates while having a predetermined curvature. In this state, the glass substrate is again maintained for the predetermined time (e.g., about one second). Next, as the rotatable plate is returned to the original state, the glass substrate remains flat in the initial state by disposing the window substrate on the stationary plate and the rotatable plate, which are placed on the same plane, so that one cycle is completed. The folding velocity is 2.4 seconds/time, and the total time required is 124 hours. The number of times of folding (cycle) is 200,000 times. When no abnormality occurs in the window substrate after the window substrate is folded 200,000 times, the folding reliability of the window substrate is evaluated as OK. When abnormality such as damage occurs in the window substrate after the window substrate is folded 200,000 times, the folding reliability of the window substrate is evaluated as NG.

Conditions in the folding reliability test may be changed. When the rotatable plate is parallel to the stationary plate in the state in which the rotatable plate is spaced apart from the stationary plate, the distance between the rotatable plate and the stationary plate is D, and D/2 substantially corresponds to the radius of curvature. The distance D may be controlled to be about 1 mm to about 10 mm, using the folding gear.

For example, the conditions in the folding reliability test may be changed depending on a thickness of the window substrate WD, a target radius of curvature, and a compressive stress after chemical reinforcement by the ion exchange process. In addition, the folding reliability test may be performed in one direction. However, the folding reliability test may be performed in one direction and the opposite direction thereof.

In one or more embodiments, the window substrate may have a repulsive force of 20 N or less when the window substrate is deformed. When the window substrate is applied to a display device, etc., the window substrate may be folded plural times, and the repulsive force when a user folds the window substrate WD is preferably to a degree such that the user does not feel inconvenient.

The repulsive force against deformation of the window substrate may be defined by the following Equations 1 and 2.

$$F = \left(\frac{wt}{6E}\right)\sigma^2 \quad \text{Equation 1}$$

$$\sigma_{max} = 1.198\left(\frac{Et}{D-t}\right) \quad \text{Equation 2}$$

In Equations 1 and 2, E is Young's modulus, t is glass thickness, w is width of the window substrate, and D is distance between both end portions of the window substrate, which face each other in folding. The folding is performed in a form in which the window substrate having the width w is folded such that both the end portions of the window substrate face each other. Since D corresponds to two times of the radius of curvature of the window substrate, the window substrate may have a radius of curvature of about 1 mm to about 10 mm or about 1 mm to about 5 mm, which satisfies a value of D corresponding thereto.

In one or more embodiments, the window substrate has a high bending strength. The bending strength may be checked through a 2 point bending test. The 2 point bending test is performed in such a manner that prepares lower and upper jigs parallel to each other, places a sample (e.g., 7.2 inches) having a predetermined size between the lower and upper jigs in a state in which the sample is bent, and then applies a load to the upper jig in a lower direction. At this time, the sample is bent such that both end portions of the sample face each other. One of both the end portions is in contact with the upper jig, and the other of both the end portions is in contact with the lower jig. In the 2 point bending test, the maximum load where the sample is not damaged is measured. In an embodiment, the window substrate may exhibit a bending strength of 1.3 GPa or more.

In one or more embodiments, the window substrate may have a radius of curvature of about 1 mm to about 10 mm or about 1 mm to about 5 mm. In this case, there is no damage of the window substrate. In one or more embodiments, although the window substrate is damaged, shattering in the damage is prevented.

In one or more embodiments, it has been illustrated that the window substrate includes the first glass substrate GL1, the second glass substrate GL2, and the interlayer ML between the first and second glass substrates GL1 and GL2. However, this is provided for convenience of description, and the inventive concepts are not limited thereto. For example, the window substrate may further include three or more glass substrates, and interlayers may be provided between the respective glass substrates.

Figure 3:
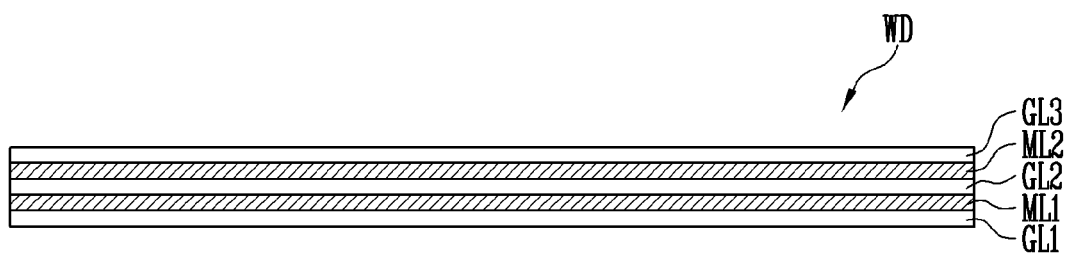
FIG. 3 is a cross sectional view of a second embodiment of a window substrate constructed according to the principles of the invention.

FIG. 3 is a cross-sectional view of a second embodiment of a window substrate constructed according to the principles of the invention.

Referring to FIG. 3, the window substrate WD may include a first glass substrate GL1, a second glass substrate GL2, and a third glass substrate GL3, which are sequentially stacked. A first interlayer ML1 may be provided between the first glass substrate GL1 and the second glass substrate GL2, and a second interlayer ML2 may be provided between the second glass substrate GL2 and the third glass substrate GL3.

In this embodiment, thicknesses of each of the first to third glass substrates GL1, GL2, and GL3 may be equal to one another, but in other embodiment they may vary from one another. As described above, when the window substrate WD is folded such that a portion of any one of the surfaces of the window substrate WD and the rest of the surface face each other, the thicknesses of the first to third glass substrates GL1, GL2, and GL3 may be determined so as to minimize stresses applied to the first to third glass substrates GL1, GL2, and GL3.

For example, the window substrate WD may be bent about a folding line at a surface of the third glass substrate GL3, such that a portion of the surface of the third glass substrate GL3 and the rest of the surface of the third glass substrate GL3 face each other. In this case, one surface of the first glass substrate GL1 becomes an outer circumferential surface, and one surface of the third glass substrate GL3 becomes an inner circumferential surface. In this case, the thickness of the first glass substrate GL1 may have a smaller value than those of the second and third glass substrates GL2 and GL3. In the same manner, the thickness of the second glass substrate GL2 may have a smaller value than that of the third glass substrate GL3. In an embodiment, when the window substrate WD is bent, thicknesses of the first interlayer ML1 and the second interlayer ML2 may also have different values so as to enhance the damping effect of the first interlayer ML1 and the second interlayer ML2.

Figure 4:
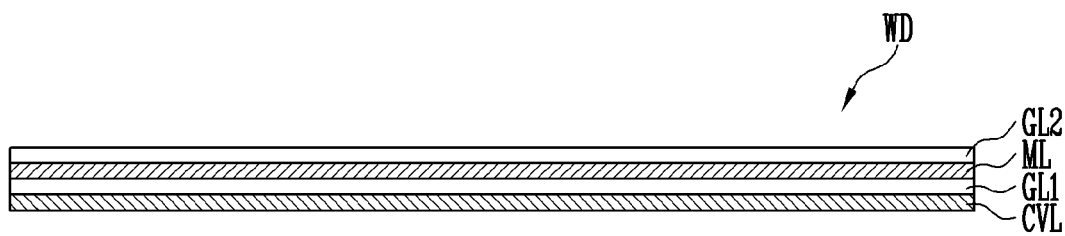
FIG. 4 is a cross sectional view of a third embodiment of a window substrate constructed according to the principles of the invention.

FIG. 4 is a cross-sectional view of a third embodiment of a window substrate constructed according to the principles of the invention.

Referring to FIG. 4, the window substrate WD may include various functional layers. For example, the window substrate WD may further include a cover layer CVL provided as a functional layer on one surface thereof.

In one or more embodiments, the cover layer CVL may be provided on a surface of the window substrate WD at a side facing a user. That is, the cover layer CVL is a surface that is directly exposed to the user, and may be provided on a surface with which a user's finger, a stylus pen, or another external object is in contact.

The cover layer CVL may be an anti-reflection layer that minimizes reflection on a surface of a glass substrate. The cover layer CVL may be an anti-stain layer that prevents a stain or smudge such as a user's handprint (e.g., a fingerprint), but inventive concepts are not limited thereto. In addition, although the cover layer CVL is illustrated as a single layer in FIG. 4, the inventive concepts are not limited thereto, and a layer having various functions may be provided as a plurality of layers.

In this embodiment, only the cover layer CVL disposed on the surface facing the user in the window substrate has been illustrated as a functional layer, but inventive concepts are not limited thereto. The functional layer may be disposed on a back surface that does not face the user. In this case, the functional layer may be an additional layer for improving the impact resistance of the window substrate and preventing scattering damage of the window substrate. The additional layer may include at least one selected from urethane-based resin, epoxy-based resin, polyester-based resin, polyether-based resin, acrylate-based resin, acrylonitrile-butadiene-styrene (ABS) resin, and rubber. The additional layer may be directly coupled to the window substrate. The additional layer may be formed on the window substrate using a coating technique. For example, the additional layer may be formed on the window substrate using slip coating, bar coating, spin coating, or the like.

Although not shown in this figure, the window substrate WD may have a first glass substrate GL1 and/or a second glass substrate GL2 formed in various shapes, e.g., formed with a protruding part or recessed part. According to this type of embodiment, the first glass substrate GL1 and/or the second glass substrate GL2 may have a recessed part that is concave inwardly from a surface at the back surface. The shape of the recessed part may be variously provided. When viewed in plan, the recessed part may be formed with various sizes at various positions on the glass substrate. For example, in consideration of the direction in which the glass substrate is to be folded or rolled, the recessed part may be provided in an area corresponding to the direction. For example, when the glass substrate is folded or rolled such that one surface of the glass substrate becomes an inner circumferential surface, the recessed part may be provided on the one surface. Alternatively, the recessed part may be formed in an area corresponding to the almost entire surface of the glass substrate.

When the recessed part is provided in the entire area or a partial area on the glass substrate, the thickness of the glass substrate in the area in which the recessed part is provided decreases, and hence the tensile stress generated in the glass substrate decreases. As a result, the glass substrate is more easily bent or rolled.

The above-described window substrate WD may be incorporated with various devices as recognized by the skilled artisan. Particularly, the window substrate WD may be used as a protective substrate for protecting a display panel to a display device.

Figure 5:
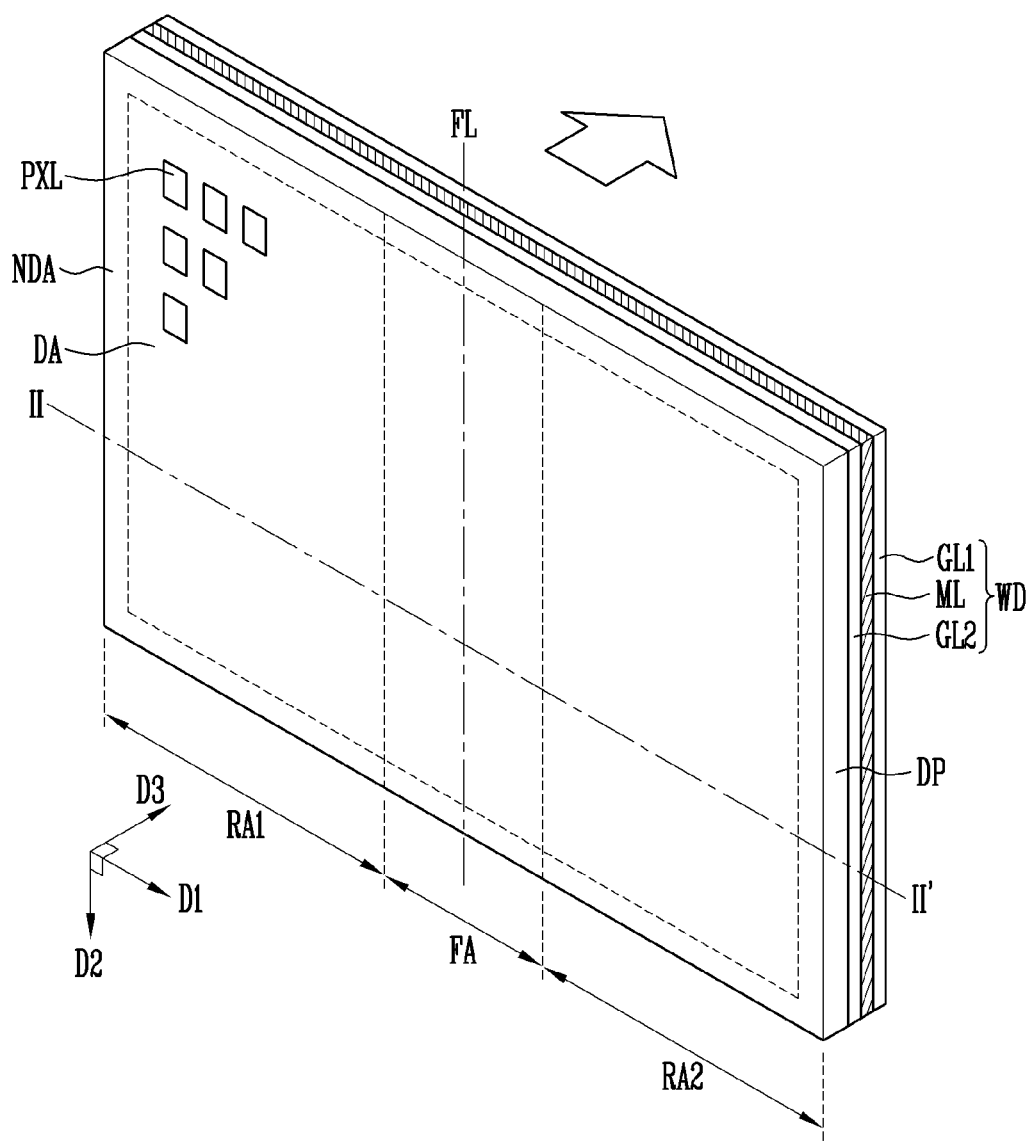
FIG. 5 is a perspective view of a first embodiment of a display device constructed according to the principles of the invention having a window substrate according to FIG. 1A.
Figure 6A:
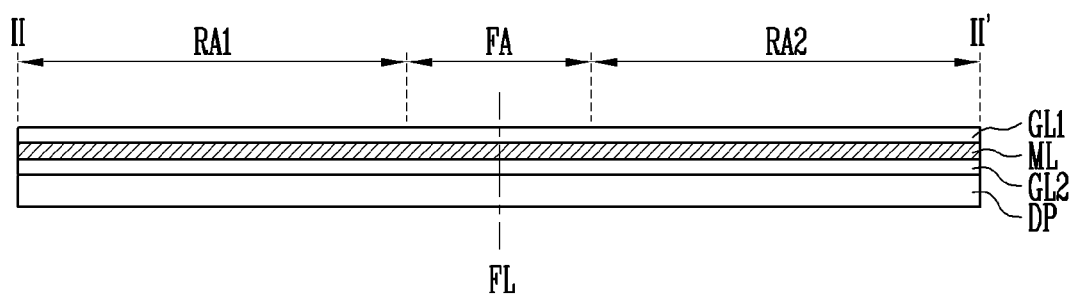
FIG. 6A is a cross-sectional view of the display device of FIG. 5 in an unfolded position taken along line II-II' of FIG. 5.
Figure 6B:
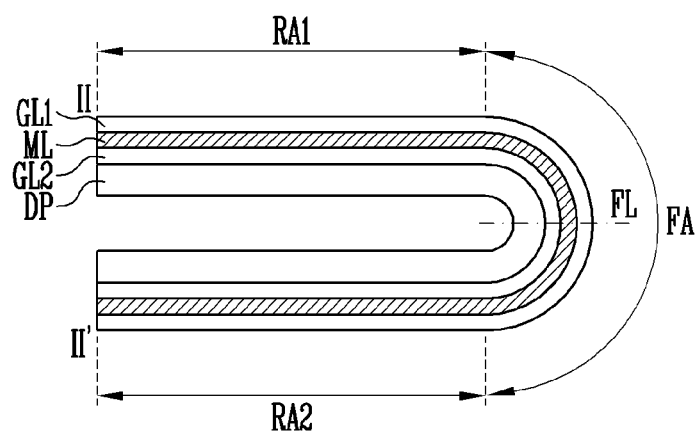
FIG. 6B is a cross-sectional view of the display device of FIG. 5 in a folded position taken along line II-II' of FIG. 5.

FIG. 5 is a perspective view of a first embodiment of a display device constructed according to the principles of the invention having a window substrate according to FIG. 1A. FIG. 6A is a cross-sectional view of the display device of FIG. 5 in an unfolded position taken along line II-II' of FIG. 5. FIG. 6B is a cross-sectional view of the display device of FIG. 5 in a folded position taken along line II-II" of FIG. 5.

Referring to FIGS. 5, 6A, and 6B, the display device according to this embodiment can be folded or curved.

The display device includes a display panel DP that displays an image and a window substrate WD provided on one surface of the display panel DP.

The display panel DP displays, on a front surface thereof, arbitrary visual information, e.g., a text, a video, a picture, a two-dimensional or three-dimensional image, etc. The kind of the display panel DP is not limited as long as the display panel DP is capable of displaying images.

The entire or at least a portion of the display panel DP may have flexibility. For example, the display panel DP may have flexibility in the entire area thereof. Alternatively, the display panel DP may have flexibility in an area corresponding to a flexible area FA.

In the illustrated embodiment, the display panel DP is provided in the shape of a plate having a front surface on which an image is displayed and a back surface opposite to the front surface. The display panel DP displays an image on the front surface. In one or more embodiments, the display panel DP may display an image on both of the front and back surfaces. However, in this embodiment, a case where an image is displayed on the front surface is described as an example. In FIG. 5, the direction of the front surface on which an image is displayed has been indicated by an arrow.

The display panel DP includes a display area DA in which the image is displayed and a non-display area NDA located at at least one side of the display area DA. For example, the non-display area NDA may be provided in a shape surrounding the display area DA.

The display area DA is an area in which a plurality of pixels PXL is provided to display an image as is known in the art.

The display area DA may be provided in a shape corresponding to that of the display device. For example, like the shape of the display device, the display area DA may be provided in various shapes such as a closed-shape polygon including linear sides, a circle, an ellipse, etc., including curved sides, and a semicircle, a semi-ellipse, etc., including linear and curved sides. In the illustrated embodiment, the display area DA is provided in a rectangular shape.

The pixels PXL are provided on the display area DA. Each of the pixels PXL is a minimum unit for displaying an image, and may be provided in plurality. The pixels PXL may emit white light and/or color light. Each pixel PXL may emit light of one of red, green, and blue, but the inventive concepts are not limited thereto. For example, each pixel PXL may emit light of a color such as cyan, magenta, or yellow.

The pixel PXL may be a light emitting device including an organic light emitting layer, but the inventive concepts are not limited thereto. For example, the pixel may be implemented in various forms such as a liquid crystal device, an electrophoretic device, and an electrowetting device.

The pixels PXL will be described subsequently.

The window substrate WD is provided on the front surface of the display panel DP, and includes a first glass substrate GL1, a second glass substrate GL2, and an interlayer ML between the first glass substrate GL1 and the second glass substrate GL2. The above-described window substrates may be used as the window substrate WD, and therefore, only differences with the above disclosure will be primarily described to avoid redundancy.

The display panel DP may be provided on the first glass substrate GL1 or the second glass substrate GL2 of the window substrate WD. In the illustrated embodiment, the display panel DP is provided on the second glass substrate GL2, so that the window substrate WD and the display panel DP are arranged in a form in which the outer surface of the second glass substrate GL2 and the front surface of the display panel DP are in contact with each other. However, the arrangement of the window substrate WD and the display panel DP is not limited thereto, and the display panel DP may be provided on the first glass substrate GL1, so that the window substrate WD and the display panel DP are arranged in a form in which the outer surface of the first glass substrate GL1 and the front surface of the display panel DP are in contact with each other.

Although not shown in these figures, an optically clear adhesive layer may be provided between the display panel DP and the window substrate WD. The optically clear adhesive layer between the display panel DP and the window substrate WD may be selected from materials constituting the interlayer ML. However, the material of the optically clear adhesive layer is not limited thereto.

In this embodiment, the window substrate WD allows an image from the display panel DP to be transmitted therethrough and simultaneously reduces impact from the outside, so that it is possible to prevent the display panel DP from being damaged or erroneously operated due to the impact from the outside. The impact from the outside refers to a force from the outside, such as stress, which causes a defect of the display panel DP.

The window substrate WD, as described above, may have elasticity to absorb the impact from the outside and simultaneously distribute the impact from the outside to surroundings thereof. For example, the window substrate WD is deformed by impact from the outside, and may have elasticity that enables the window substrate WD to return to the original state when the impact from the outside is eliminated. In addition, the window substrate WD has an excellent impact resistance in which the window substrate WD is less deformed or damaged due to impact from the outside.

The window substrate WD reduces bending deformation of the display panel DP due to a point impact and a surface impact and compressive deformation and/or tensile deformation of the display panel DP due to a surface impact, thereby preventing a failure of the display panel DP.

The entire or at least a portion of the window substrate WD may have flexibility. For example, the display panel DP may have flexibility in the entire area or a partial area thereof.

The display device including the display panel DP and the window substrate WD may be provided in various shapes. For example, the window substrate WD may be provided in plate shape corresponding to the shape of the display panel DP, and may cover at least a portion of the front surface of the display panel DP. For example, when the display panel DP is provided in a rectangular shape, the window substrate WD may also be provided in a rectangular shape corresponding to that of the display panel DP. Alternatively, when the display panel DP is provided in a circular shape, the window substrate WD may also be provided in a circular shape corresponding to that of the display panel DP.

In one or more embodiments, although shapes of the display panel DP and the window substrate WD have minute differences, the display panel DP and the window substrate WD may be provided in substantially the same shape. Accordingly, the display device including the display panel DP and the window substrate WD may be provided in the shape of a rectangular plate. For ease of description, the illustrated embodiment shows a case where the display device is provided in a rectangular shape having a pair of long sides and a pair of short sides. In addition, FIG. 5 illustrates the longer sides extending in a first direction D1 and the short sides extending in a second direction D2, and the direction perpendicular to the extending directions of the long and short sides is a third direction D3. However, the shape of the display device is not limited thereto, and the display device may have various shapes. For example, the display device may be provided in various shapes such as a closed-shape polygon including linear sides, a circle, an ellipse, etc., including curved sides, and a semicircle, a semi-ellipse, etc., including linear and curved sides. In an embodiment, when the display device has linear sides, at least one portion of corners of each of the shapes may be formed in a curve. For example, when the display device has a rectangular shape, a portion at which adjacent linear sides meet each other may be replaced with a curve having a predetermined curvature. That is, a vertex portion of the rectangular shape may be formed with a curved side having both adjacent ends respectively connected to two adjacent linear sides, with the curved side having a predetermined curvature. The curvature may be differently determined depending on position. For example, the curvature may be changed depending on the position at which the curve is started, a length of the curve, etc.

At least one portion of the display device may have flexibility, and the display device may be folded about a folding line or axis provided in the portion having the flexibility. That is, the display device may include a flexible area FA having the flexibility, the flexible area FA being the area in which the display device is foldable, and a rigid area RA provided at at least one side of the flexible area, the rigid area RA being the area(s) in which the display device is not folded.

In this embodiment, an area in which the display panel is not folded is referred to as the rigid area RA, but this is provided for convenience of description. The term "rigid" includes not only the case where the rigid area is hard without any flexibility but also the case where the rigid area has a smaller amount of flexibility than the flexible area FA and a case where the rigid area has flexibility but is not foldable.

In one or more embodiments, the entire display device may correspond to the flexible area FA. For example, in the case of a display device bent into a roll shape, the entire display device may correspond to the flexible area.

FIG. 5 illustrates an embodiment in which a first rigid area RA1, the flexible area FA, a second rigid area RA2 are sequentially arranged along the first direction D1. The flexible area FA extends longitudinally across the display area DA along the second direction D2.

When assuming that the center line about which the display device is folded is a folding line FL, the folding line FL is provided in the flexible area FA. This embodiment illustrates that the folding line FL passes through the center of the flexible area FA, and the flexible area FA is symmetrically disposed with respect to the folding line FL, but the inventive concepts are not limited thereto. That is, the folding line FL may be provided asymmetrically in the flexible area FA. The flexible area FA and the folding line FL on the flexible area FA may overlap with an area in which an image of a display panel DP is displayed. When the display device is folded, the area in which the image is displayed may be bent.

This embodiment illustrates a state in which one surface of each of the two rigid areas are located in parallel to each other and folded to face each other. However, the inventive concepts are not limited thereto. For example, the surfaces of the two rigid areas may be folded to form a predetermined angle (e.g., an acute angle, a right angle, or an obtuse angle) with the flexible area interposed therebetween.

In the display device, the folding line FL is provided in the flexible area FA along the second direction D2 that is the extending direction of the flexible area FA. Accordingly, the display device can be folded in the flexible area FA.

In one or more embodiments, when the display device is folded along the folding line FL, the display device may be folded such that two portions of a surface opposite to a surface on which an image is displayed face each other. A window substrate WD may be exposed at the outermost side in the state in which the display device is folded. In this case, the image can be provided to the outside even in the state in which the display device is folded, and a user can view the image regardless of whether the display device is folded. However, the folding direction of the display device is not limited thereto. When the display device is folded along the folding line FL, unlike as shown in FIG. 6B, the display device may be folded such that two portions of the surface on which the image is displayed face each other.

For convenience of description, this embodiment illustrates that the first and second rigid areas RA1 and RA2 have areas similar to each other, and the flexible area FA is located between the two rigid areas RA1 and RA2, but the inventive concepts are not limited thereto. For example, the first and second rigid areas RA1 and RA2 may have areas different from each other. In addition, the number of rigid areas is not necessarily two, and may be one or three or more. In this case, a plurality of rigid areas may be provided to be spaced apart from each other with the flexible area FA interposed therebetween.

In one or more embodiments, the flexible area FA and the rigid areas of the window substrate WD may have different thicknesses, different repulsive forces, different impact resistances, and the like. When repetitive bending occurs in a specific area (e.g., the flexible area FA) even though the window substrate WD is entirely flexible, stress in the specific area may be increased as compared with the other areas, and the window substrate WD may be deformed such that damage from bending stresses is prevented.

For example, each index of the window substrate WD in the flexible area FA may be differently determined by changing the thickness of the first glass substrate GL1 and/or the second glass substrate GL2 or by changing the depth where chemical reinforcement is performed on the first glass substrate GL1 and/or the second glass substrate GL2.

Next, each pixel in the display panel will be described.

Figure 7:
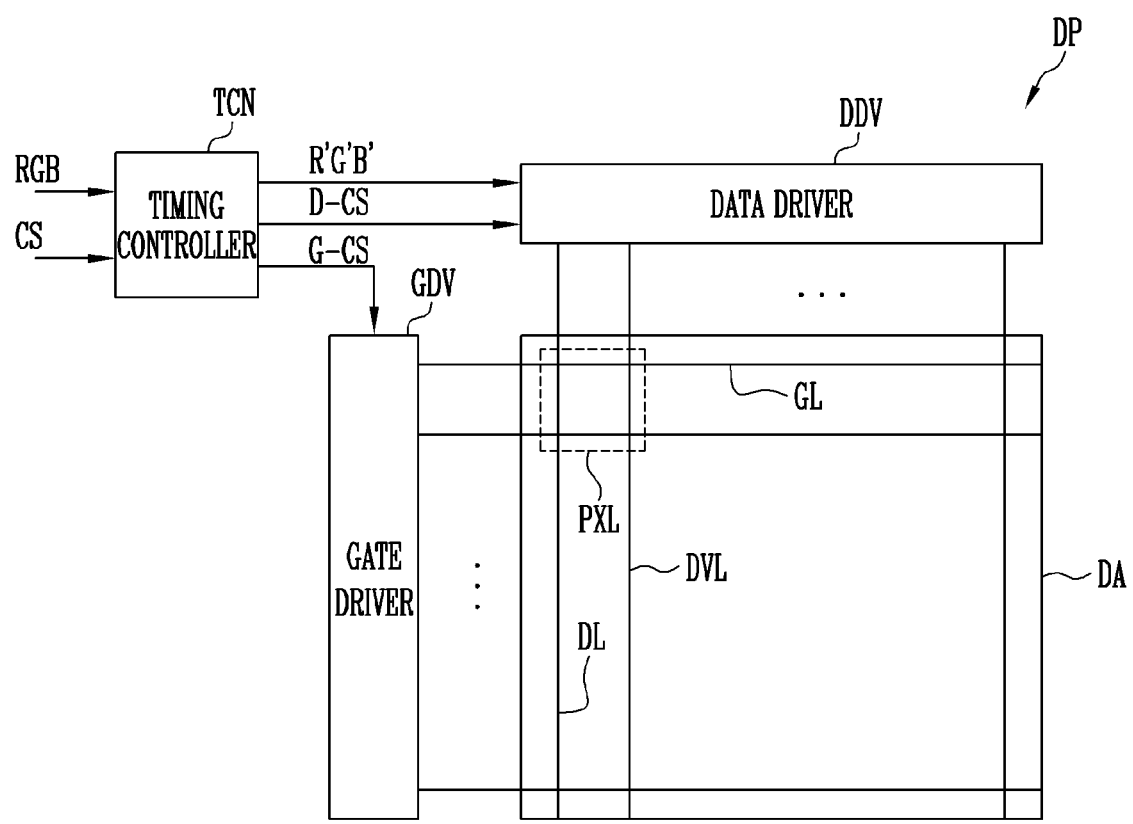
FIG. 7 is a block diagram of the major electronic components of a display panel constructed according to the principles of the invention.
Figure 8:
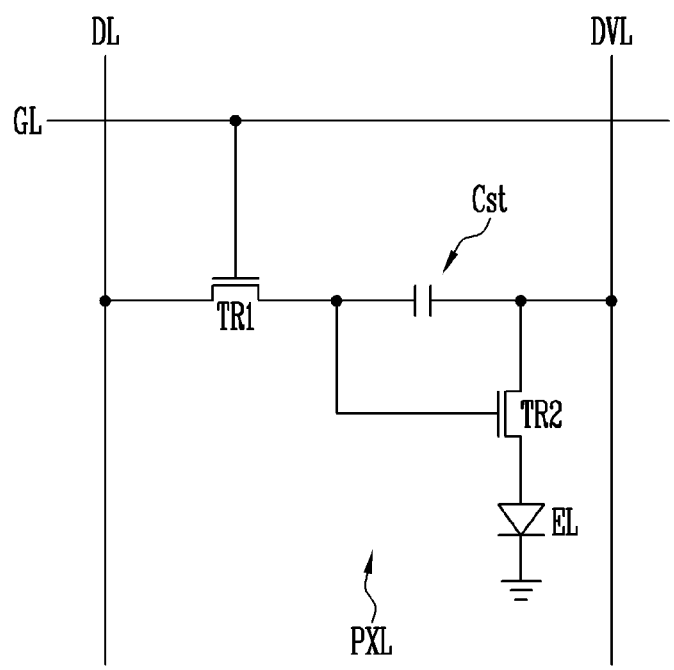
FIG. 8 is a circuit diagram of one of the pixels in FIG. 7.

FIG. 7 is a block diagram of the major electronic components of a display panel DP constructed according to the principles of the invention. FIG. 8 is a circuit diagram of one of the pixels PXL in FIG. 7.

Referring to FIGS. 7 and 8, the display panel DP constructed according to the principles of the invention includes pixels PXL provided on a display area DA, gate and data drivers GDV and DDV for driving the pixels PXL, and a timing controller TCN for controlling the driving of the gate and data drivers GDV and DDV.

Each pixel PXL is provided on the display area DA, and includes a line unit including a gate line GL, a data line DL, and a driving voltage line DVL, a thin film transistor connected to the line unit, an organic light emitting device EL connected to the thin film transistor, and a capacitor Cst.

The gate line GL extends in one direction. The data line DL extends in another direction intersecting the gate line GL. The driving voltage line DVL extends in the substantially same direction as the data line DL. The gate line GL transmits a gate signal to the thin film transistor. The data line DL transmits a data signal to the thin film transistor. The driving voltage line DVL provides a driving voltage to the thin film transistor.

The thin film transistor may include a driving thin film transistor TR2 for controlling the organic light emitting device EL and a switching thin film transistor TR1 for switching the driving thin film transistor TR2. In the illustrated embodiment one pixel PXL includes two thin film transistors TR1 and TR2. However, the inventive concepts are not limited thereto, and the one pixel PXL may include one thin film transistor and one capacitor, or may include three or more thin film transistors and two or more capacitors.

A gate electrode of the switching thin film transistor TR1 is connected to the gate line GL, and a source electrode of the switching thin film transistor TR1 is connected to the data line DL. A drain electrode of the switching thin film transistor TR1 is connected to a gate electrode of the driving thin film transistor TR2. The switching thin film transistor TR1 transmits, to the driving thin film transistor TR2, a data signal applied to the data line DL, in response to a gate signal applied to the gate line GL.

The gate electrode of the driving thin film transistor TR2 is connected to the drain electrode of the switching thin film transistor TR1, and a source electrode of the driving thin film transistor TR2 is connected to the driving voltage line DVL. A drain electrode of the driving thin film transistor TR2 is connected to the organic light emitting device EL.

The organic light emitting device EL includes a light emitting layer (not shown), and a first electrode (not shown) and a second electrode (not shown), which are opposite to each other with the light emitting layer interposed therebetween. The first electrode is connected to the drain electrode of the driving thin film transistor TR2. A common voltage is applied to the second electrode, and the light emitting layer emits light according to an output signal of the driving thin film transistor TR2, so that light is emitted or is not emitted, thereby displaying an image. The light emitted from the light emitting layer may be white light or color light.

The capacitor Cst may be connected between the gate electrode and the source electrode of the driving thin film transistor TR2. The capacitor Cst charges and maintains a data signal input to the gate electrode of the driving thin film transistor TR2.

The timing controller TCN receives a plurality of image signals RGB and a plurality of control signals CS from an outside of the display device. The timing controller TCN converts data formats of the image signals RGB to be suitable for interface specifications with the data driver DDV, and provides the converted image signals R'G'B' to the data driver DDV. In addition, the timing controller TCN generates a data control signal D-CS (e.g., an output start signal, a horizontal start signal, etc.) and a gate control signal G-CS (e.g., a vertical start signal, a vertical clock signal, vertical clock bar signal, etc.), based on the plurality of control signals CS. The data control signal D-CS is provided to the data driver DDV, and the gate control signal G-CS is provided to the gate driver GDV.

The gate driver GDV sequentially output a gate signal in response to the gate control signal G-CS provided from the timing controller TCN. Thus, the plurality of pixels PXL can be sequentially scanned in unit of rows by the gate signal.

The data driver DDV converts the image signals R'G'B' into data signals and outputs the converted data signals, in response to the data control signal D-CS provided from the timing controller TCN. The output data signals are applied to the pixels PXL.

Thus, each pixel PXL is turned on by the gate signal, and the turned-on pixel PXL receives a corresponding data voltage from the data driver DDV, thereby displaying an image having a desired gray level.

Figure 9:
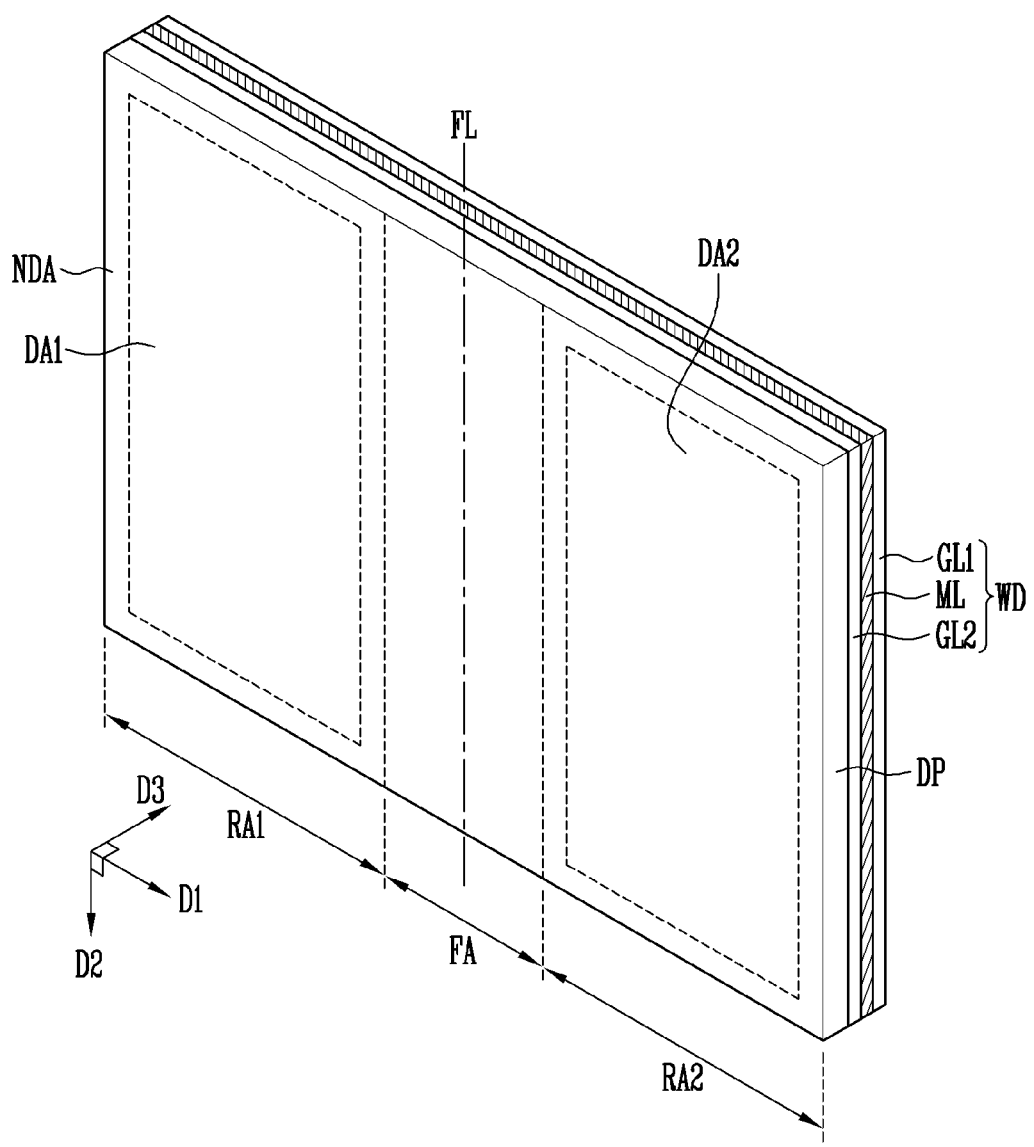
FIG. 9 is a perspective view illustrating a second embodiment of a display device constructed according to the principles of the invention having a window substrate according to FIG. 1A foldable about a single folding line.

FIG. 9 is a perspective view illustrating a display device according to an embodiment, in which two display areas are provided.

Referring to FIG. 9, the display device may include a plurality of display areas. For example, the display device may include a first display area DA1 and a second display area DA2. A non-display area NDA may be provided at the outer periphery of the first display area DA1 and the second display area DA2, and the first display area DA1 and the second display area DA2 may be spaced apart from each other with the non-display area NDA interposed therebetween. When viewed in plan, a display panel DP may include a first rigid area RA1, a second rigid area RA2, and a flexible area FA disposed between the first rigid area RA1 and the second rigid area RA2. The flexible area FA may overlap with the non-display area NDA between the first display area DA1 and the second display area DA2.

Like the above-described embodiments, a folding line FL may be provided substantially parallel to any one side of the display device. However, the inventive concepts are not limited thereto, and the folding line FL may be disposed in various directions regardless of the shape of the display device. For example, in one or more embodiments, the folding line FL may be provided oblique to any one side of the display device.

Figure 10:
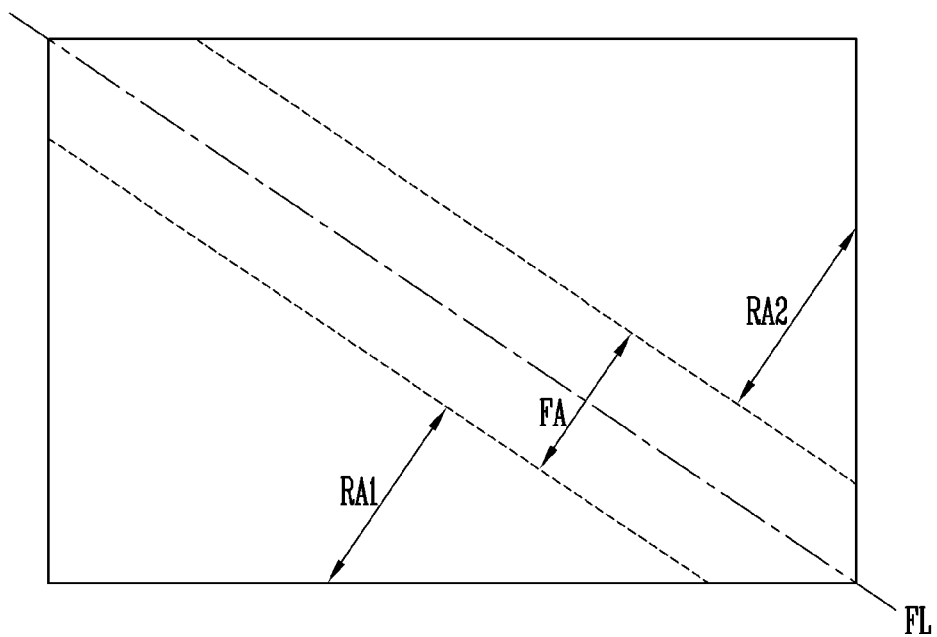
FIG. 10 is a plan view illustrating a display device according to one or more embodiments schematically illustrating only two rigid areas, a flexible area, and a folding line.

FIG. 10 is a plan view illustrating a display device according to one or more embodiments, schematically illustrating only two rigid areas, a flexible area, and a folding line.

Referring to FIG. 10, in this embodiment, the display device is provided in a rectangular shape, and a folding line FL is provided along a diagonal line of the rectangular shape. In the display device, a flexible area FA is also provided in a diagonal direction along the folding line FL, and a first rigid area RA1 and a second rigid area RA2 may be provided at both sides of the flexible area FA, respectively.

In one or more embodiments, a single folding line may be provided. However, the inventive concepts are not limited thereto, and plural folding lines FL may be provided.

Figure 11A:
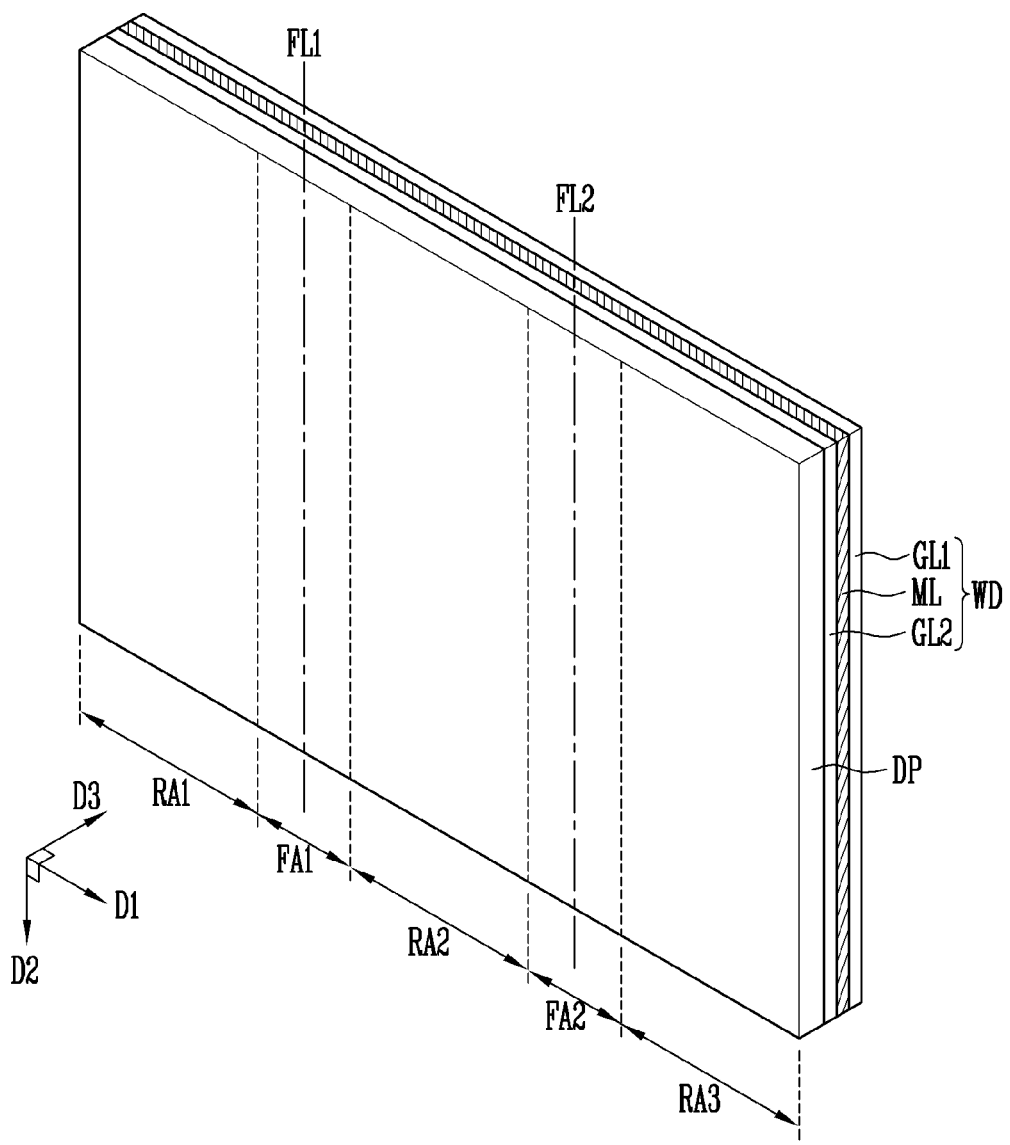
FIG. 11A is a perspective view illustrating a third embodiment of a display device constructed according to the principles of the invention having a window substrate according to FIG. 1A foldable about two folding lines.
Figure 11B:
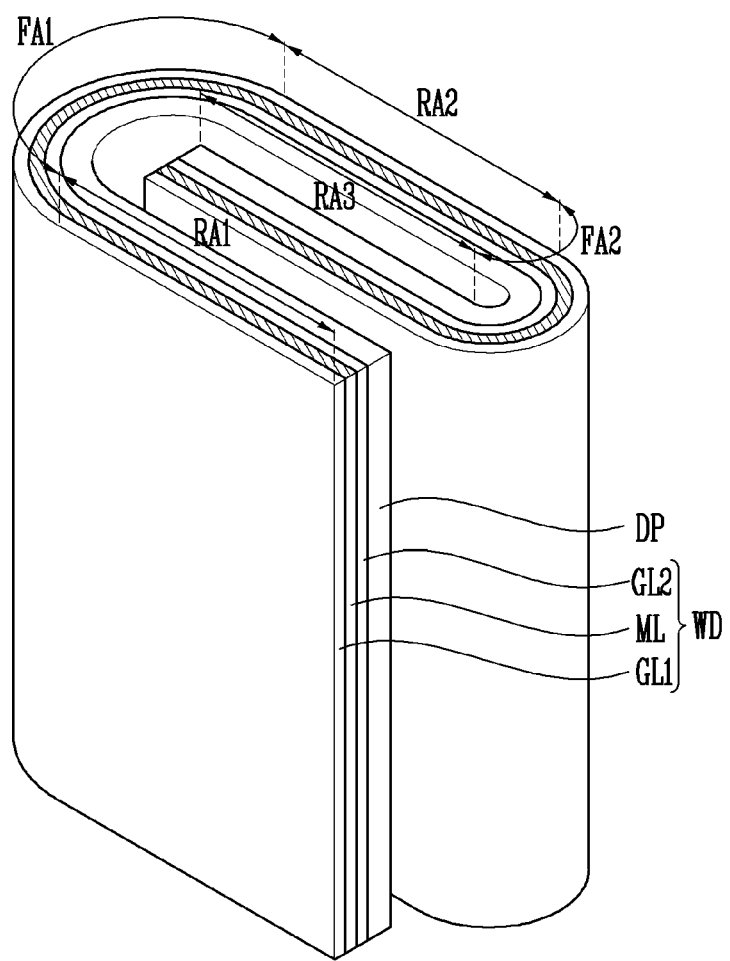
FIG. 11B is a perspective view illustrating the display device of FIG. 11A in a folded position.

FIG. 11A is a perspective view illustrating a third embodiment of a display device constructed according to the principles of the invention having a window substrate according to FIG. 1A foldable about two folding lines. FIG. 11B is a perspective view illustrating the display device of FIG. 11A in a folded position.

Referring to FIGS. 11A and 11B, a plurality of folding lines are provided, and therefore, the display device may have a plurality of flexible areas and a plurality of rigid areas. This embodiment describes as an example two folding lines, i.e., a first folding line FL1 and a second folding line FL2, and correspondingly, a first rigid area RA1, a first flexible area FA1, a second rigid area RA2, a second flexible area FA2, and a third rigid area RA3 sequentially disposed in a first direction D1. The first flexible area FA1 and the second flexible area FA2 may extend in a second direction D2 corresponding to the first folding line FL1 and the second folding line FL2, respectively.

As shown in FIG. 11B, the display device may be folded in the first flexible area FA1 and the second flexible area FA2. This figure illustrates that the display device is folded such that the third rigid area RA3 is located between the first rigid area RA1 and the second rigid area RA2, but the inventive concepts are not limited thereto. In another embodiment, the display device may be folded such that the second rigid area RA2 is located between the first rigid area RA1 and the third rigid area RA3.

This embodiment illustrates both of the first folding line FL1 and the second folding line FL2 extending in the second direction D2. However, the first folding line FL1 and the second folding line FL2 may extend in different directions and directions different from each other. For example, the first folding line FL1 may extend in the first direction D1, and the second folding line FL2 may extend in the second direction D2. Alternatively, both of the first folding line FL1 and the second folding line FL2 extend in the first direction D1. Alternatively, the first folding line FL1 may extend in the first direction D1, and the second folding line FL2 may extend in a direction oblique to the first folding line FL1. In another embodiment, three or more folding lines may extend in any of the directions or arrangements noted above.

In one or more embodiments, a flexible area may be provided at an outermost side of the display device in one direction such that a portion of the display device is rolled like a roll.

Figure 12A:
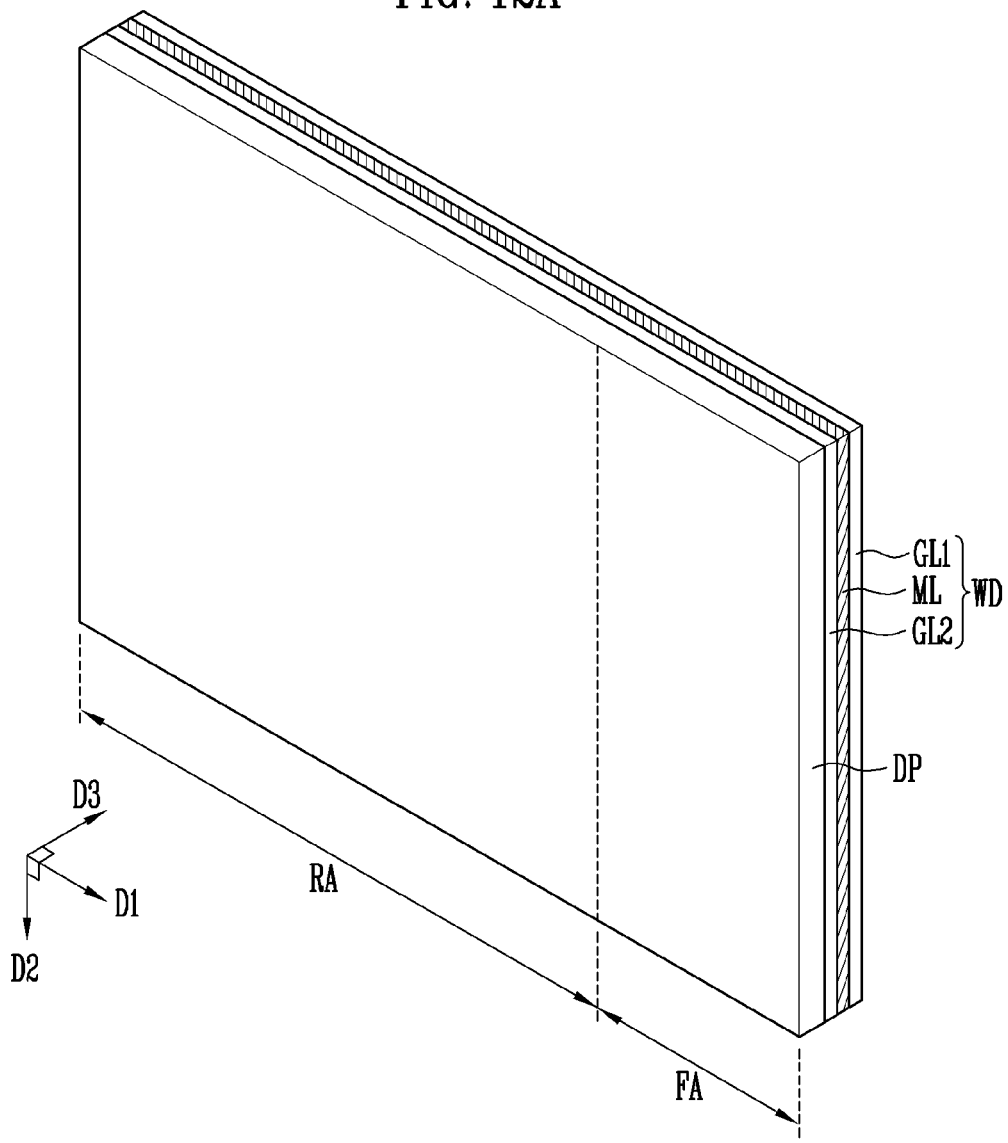
FIG. 12A is a perspective view illustrating a fourth embodiment of a display device constructed according to the principles of the invention having a window substrate according to FIG. 1A foldable about a single, offset folding line.
Figure 12B:
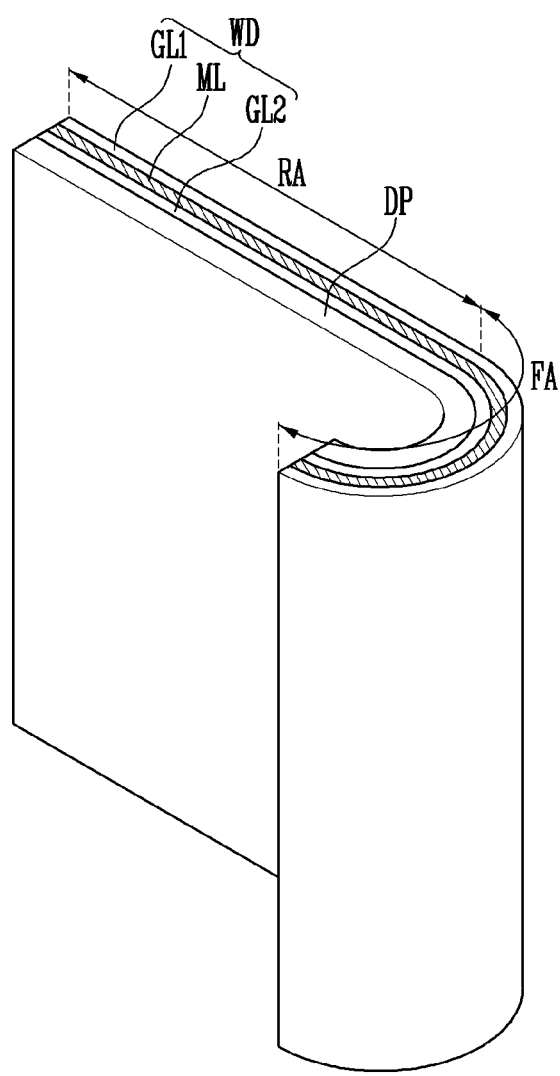
FIG. 12B is a perspective view illustrating the display device of FIG. 12A in a rolled position.

FIG. 12A is a perspective view illustrating a fourth embodiment of a display device constructed according to the principles of the invention having a window substrate according to FIG. 1A foldable about a single, offset folding line. FIG. 12B is a perspective view illustrating the display device of FIG. 12A in a rolled position.

Referring to FIGS. 12A and 12B, the display device has a rigid area RA and a flexible area FA. The flexible area FA may be provided at one side of the rigid area RA. The flexible area FA may be provided at an outermost side of the display device in a first direction D1. The display device may be rolled in the flexible area FA.

The display device having the above-described structure includes the above-described window substrate, so that the impact resistance of the display device is improved. Hence, specific evaluation of certain characteristics and test will be described in the following examples.

EXAMPLES

1. Test for Optical Characteristics and Mechanical Characteristics

The following Table 1 shows results obtained by testing optical characteristics and mechanical characteristics of existing window substrates (Comparative Example 1 and Comparative Example 2) and a window substrate constructed according to the principles of the invention (Embodiment).

Each of Comparative Example 1, Comparative Example 2, and Embodiment was fabricated as a substrate having an aspect ratio of 16:9, the substrate of which diagonal line has a length of 7.2 inches (180 mm×105.2 mm).

Since Comparative Example 1 was fabricated as a polyimide substrate, the substrate was formed in two layers each having a thickness of 50 μm, and the total thickness of the substrate was 100 μm. Comparative Example 2 was fabricated as a glass substrate having a thickness of 50 μm. Embodiment was fabricated to include a first glass substrate having a thickness of 30 μm, an interlayer having a thickness of 10 μm, and a second glass substrate having a thickness of 50 μm.

TABLE 1

| | | Comparative Example 1 | Comparative Example 2 | Embodiment |
|---|---|---|---|---|
| Optical characteristics | Transmittance (%) | 90.8 | 92.0 | 90.7 |
| | Yellow index | 2.1 | 0.5 or less | 1.05 |
| | Haze (%) | 1.10 | 0.05 | 1.15 |
| Mechanical characteristics | Compressive stress (MPa) | — | 800~850 | 730~850 |
| | Chemical reinforcement depth (μm) | — | 10 | 6~10 |
| | Bending strength (GPa) | — | 1.8 | 1.37, 2.46 |
| | Repulsive force (N) in radius of curvature of 3 mm | 4.7 | 6.2 | 7.7 |
| | Impact resistance (pen drop) (cm) | 3 | 2 | 4 |
| | Pencil Hardness | 8H | 4H | 9H |
| | Impact absorption load (gf) | 0.1 | 2.5 | 5.9 |
| | Folding reliability (200,000 times) | OK | OK | OK |
| External appearance | Thickness homogeneity (%) | 5 or less | 2.50 | 2.5~5 |
| Stability | Scattering | None | None | None |

In Table 1, the compressive stress refers to the compressive stress of each glass substrate in Comparative Example 2 and Embodiment. The chemical reinforcement depth refers to an ion exchange depth (depth of length) of each glass substrate in Comparative Example 2 and Embodiment.

The bending strength refers to a maximum load checked through the 2 point bending test. The impact absorption load refers to a load that each of the window substrates of Comparative Example 1, Comparative Example 2, and Embodiment absorbs when a load of 91.2 gf was applied to the window substrate by an iron ball having a diameter of 25.4 mm and a mass of 5.5 g freely dropped at a height of 5 cm above a surface of the window substrate. The folding reliability represents whether the example passed a Clamshell folding reliability of 200,000 cycles. The thickness homogeneity represents an average of differences in thickness at 9 points specified at an equal distance in lateral and longitudinal directions with respect to each window substrate.

Referring to Table 1, Embodiment exhibits optical characteristics and mechanical characteristics, which correspond to those of Comparative Example 1 and Comparative Example 2. Particularly, the impact resistance (pen drop) of Embodiment is 4 cm, which is an improved value compared to 3 cm of Comparative Example 1 and 2 cm of Comparative Example 2. The impact absorption load of Embodiment also exhibited a surprisingly larger value than Comparative Example 1 and Comparative Example 2.

2. Evaluation of Impact Resistances (Pen Drop)

The following Table 2 shows results obtained by testing impact resistances (pen drop) of an existing window substrate (Comparative Example) and window substrates constructed according to principles of the invention (Embodiment 1 to Embodiment 5).

TABLE 2

| Items | Thickness (μm) | | | Pen drop height (cm) | Sum of thicknesses of first and second glass substrates (μm) |
| --- | --- | --- | --- | --- | --- |
| | First glass substrate | Interlayer | Second glass substrate | | |
| Comparative Example | 50 | — | — | 2 | 50 |
| Embodiment 1 | 30 | 10 | 30 | 4 | 60 |
| Embodiment 2 | 40 | 10 | 30 | 4 | 70 |
| Embodiment 3 | 50 | 10 | 30 | 6 | 80 |
| Embodiment 4 | 40 | 10 | 40 | 6 | 80 |
| Embodiment 5 | 50 | 10 | 50 | 6 | 100 |

Referring to Table 2, in the Comparative Example configured with only a glass substrate having a thickness of 50 μm, damage to the window substrate occurred at a height of 2 cm in the pen drop impact resistance test. On the other hand, in Embodiment 1 to Embodiment 5, damage to all of the window substrates occurred at a height of 4 cm or more in the pen drop impact resistance test. Accordingly, it can be seen that the impact resistances against point impact in Embodiment 1 to Embodiment 5 are improved.

In addition, even when the sum of thicknesses of first and second glass substrates is 100 μm or less, damage to all of the window substrates occurred at a height of 4 cm or more in the pen drop impact resistance test.

3. Evaluation of Impact Resistances (Ball Drop)

Figure 13:
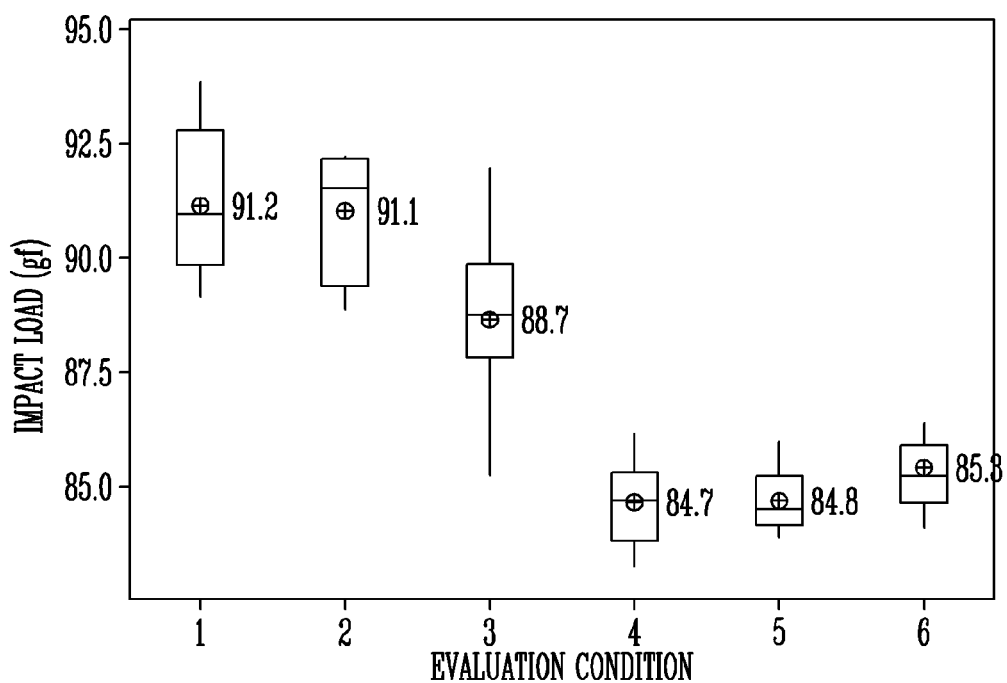
FIG. 13 is a graph illustrating impact resistances of an existing window substrate and a window substrate constructed according to the principles of the invention.

The following Table 3 shows results obtained by testing impact resistances (ball drop) of existing window substrates (Comparative Example 2 to Comparative Example 5) and a window substrate constructed according to principles of the invention (Embodiment). FIG. 13 is a graph illustrating impact resistances of an existing window substrate and a window substrate obtained from Table 3.

The impact resistance against ball drop is evaluated in a manner that measures how much impact load the window substrate absorbs when an iron ball having a diameter of 25.4 mm and a mass of 5.5 g is freely dropped at a height of 5 cm above a surface of each window substrate.

Comparative Example 1 exhibits the impact load when the iron ball is dropped without any window substrate, which impact load corresponds to 91.2 gf. Comparative Example 2 to Comparative Example 5 and Embodiment were tested using a substrate having an aspect ratio of 16:9, the substrate of which diagonal line has a length of 7.2 inches (180 mm×105.2 mm). Comparative Example 2 was fabricated as a window substrate in which a hard coating layer having a thickness of 50 μm was formed on a polyimide film having a thickness of 50 μm, and the total thickness of the window substrate was provided as 100 μm. Comparative Example 3 was provided as Gorilla Glass 3, which is a commercial product available from Corning, Inc., having a thickness of 50 μm. Comparative Example 4 was provided as Gorilla Glass 3 having a thickness of 80 μm. Comparative Example 5 was fabricated to include a polyimide film having a thickness of 40 μm and Gorilla Glass 3 having a thickness of 50 μm. Embodiment was fabricated to include a first glass substrate (Gorilla Glass 3) having a thickness of 30 μm, an interlayer (optically clear adhesive) having a thickness of 10 μm, and a second glass substrate (Gorilla Glass 3) having a thickness of 50 μm.

TABLE 3

| Evaluation conditions | Items | Bendability (radius of curvature of 5 mm) | Impact load (gf) | Absorption load (gf) | Impact absorption ratio (%) |
| --- | --- | --- | --- | --- | --- |
| 1 | Comparative Example 1 | — | 91.2 | — | — |
| 2 | Comparative Example 2 | ○ | 91.1 | 0.1 | 0.1 |
| 3 | Comparative Example 3 | X | 88.7 | 2.5 | 2.7 |
| 4 | Comparative Example 4 | X | 84.7 | 6.5 | 7.1 |
| 5 | Comparative Example 5 | ○ | 84.8 | 6.4 | 7.0 |
| 6 | Embodiment | ○ | 85.3 | 5.9 | 6.4 |

Referring to Table 3, Comparative Example 2 can be bent with a radius of curvature of 5 mm, but has a low absorption load. Comparative Example 3 and Comparative Example 4 cannot be bent with the radius of curvature of 5 mm. However, Comparative Example 5 and Embodiment can be bent with the radius of curvature of 5 mm. In addition, Comparative Example 5 and Embodiment have absorption loads of 5% or more.

4. Evaluation of Repulsive Forces

The following Table 4 shows results obtained by evaluating repulsive forces when the thicknesses of first and second glass substrates are different from each other in window substrates constructed according to principles of the invention.

TABLE 4

| Items | Thickness (μm) | | | Thickness of entire window substrate (μm) | Repulsive force (N) |
|---|---|---|---|---|---|
| | First glass substrate | Interlayer | Second glass substrate | | |
| Embodiment 1 | 30 | 10 | 30 | 70 | 3.4 |
| Embodiment 2 | 30 | 10 | 40 | 80 | 5.2 |
| Embodiment 3 | 30 | 10 | 50 | 90 | 7.7 |
| Embodiment 4 | 40 | 10 | 30 | 80 | 6.5 |
| Embodiment 5 | 40 | 10 | 40 | 90 | 7.2 |
| Embodiment 6 | 40 | 10 | 50 | 100 | 8.3 |
| Embodiment 7 | 50 | 10 | 50 | 110 | 13.5 |

Referring to Table 4, when the thickness of the first glass substrate is within a range of 30 μm to 50 μm and the thickness of the second glass substrate is within a range of 30 μm to 50 μm, all of the embodiments exhibit repulsive forces of 20 N or less.

In addition, repulsive forces of Embodiment 2 and Embodiment 4 are 5.2 N and 6.5 N, respectively, and a repulsive force when the first glass substrate is thinner than the second glass substrate has a smaller value than that when the first glass substrate is thicker than the second glass substrate. Accordingly, it can be seen that the thickness of a glass substrate located at the outside is decreased according to a direction in which the window substrate is curved, thereby decreasing the repulsive force.

4. Evaluation of Impact Resistance (Surface Impact)

Figure 14:
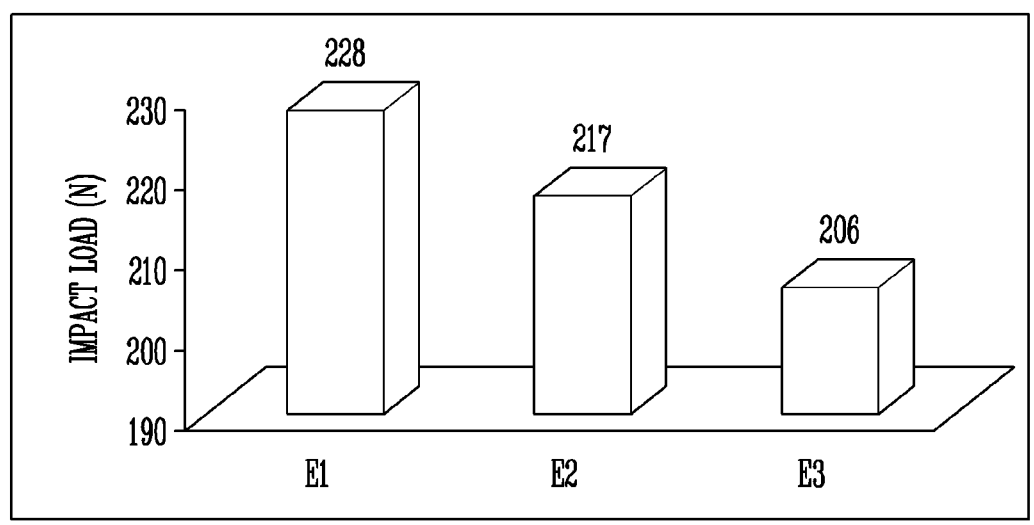
FIG. 14 is a graph illustrating impact loads of in window substrates constructed according to the principles of the invention when the thicknesses of first and second glass substrates are constant but the thicknesses of interlayers vary.

The following Table 5 shows results obtained by evaluating impact loads when the thicknesses of first and second glass substrates are constant, but the thicknesses of interlayers are different in window substrates constructed according to principles of the invention. FIG. 14 is a graph illustrating Table 5. That is, FIG. 14 is a graph illustrating impact loads of in window substrates constructed according to the principles of the invention when the thickness of first and second glass substrates are constant but the thickness of the interlayers varies.

The impact loads were evaluated using Drop tower Impact System as evaluation equipment, and evaluation was performed according to ASTM D3763 evaluation standard. The evaluation was performed in a manner that measures a load (N) at a failure point at which each window substrate is damaged when a part of 1.954 kg is freely dropped at a height of 10 cm. In this case, the impact speed in the evaluation corresponds to 0.77 m/s, and the impact energy in the evaluation corresponds to 0.579 J.

TABLE 5

| Numbers | Items | Thickness (μm) | | | Thickness of entire window substrate (μm) | Impact load (N) |
|---|---|---|---|---|---|---|
| | | First glass substrate | Interlayer | Second glass substrate | | |
| E1 | Embodiment 1 | 50 | 10 | 50 | 110 | 228 |
| E2 | Embodiment 2 | 50 | 20 | 50 | 120 | 217 |
| E3 | Embodiment 3 | 50 | 30 | 50 | 130 | 206 |

Referring to Table 5, the impact load decreases as the thickness of the interlayer increases. Hence, whenever the thickness of the interlayer increases by about 10 μm, the impact load decreases by about 5%.

5. Evaluation of Maximum Stresses

The following Table 6 shows results obtained by measuring maximum stress values in display devices employing existing window substrates (Comparative Example 1 to Comparative Example 3) and window substrates constructed according to principles of the invention (Embodiment 1 to Embodiment 3). Table 6 shows result values obtained by measuring maximum stresses applied to display panels, when the existing window substrates and the window substrates embodiments were disposed on the respective display panels, and an iron ball having a diameter of 25.4 mm and a mass of 5.5 g was freely dropped at a height of 5 cm above each of the window substrates.

TABLE 6

| Numbers | Items | Thickness (μm) | | | Thickness of entire window substrate (μm) | Maximum Stresses MPa) |
|---|---|---|---|---|---|---|
| | | First glass substrate | Interlayer | Second glass substrate | | |
| 1 | Comparative Example 1 | 30 | — | | 30 | 18.9 |
| 2 | Comparative Example 2 | 50 | — | | 50 | 18.1 |
| 3 | Comparative Example 3 | 100* | — | | 100 | 20.4 |
| 4 | Embodiment 1 | 30 | 10 | 30 | 70 | 17.3 |
| 5 | Embodiment 2 | 30 | 20 | 30 | 80 | 16.6 |
| 6 | Embodiment 3 | 30 | 30 | 30 | 90 | 16.0 |

Comparative Example 3 indicated by * was fabricated with a polyimide film instead of glass.

Referring to Table 6, Comparative Example 1 to Comparative Example 3 all exhibit maximum stresses of 18 MPa or more, but Embodiment 1 to Embodiment 3 all exhibit maximum stresses of 17.3 MPa or less. Particularly, it can be seen that, whenever the thickness of an interlayer increases by about 10 μm, the damping effect is improved by about 4%.

5. Evaluation of Folding Reliability

The following Table 7 shows results obtained by measuring folding reliabilities in display devices employing window substrates constructed according to principles of the invention (Embodiment 1 to Embodiment 7 and Comparative Example 1). In Table 7, 10 μm to 100 μm as the thickness of each interlayer means that a test was performed by changing the thickness in units of 10 μm. That is, the folding reliability was tested by changing the thickness of the interlayer to 10 μm, 20 μm, 30 μm, . . . , 100 μm.

TABLE 7

| Numbers | Items | Thickness (μm) | | | Total thickness of window substrate (μm) | Folding reliability (200,000 times) |
|---|---|---|---|---|---|---|
| | | First glass substrate | Interlayer | Second glass substrate | | |
| 1 | Embodiment 1 | 30 | 10~100 | 30 | 70~160 | OK |
| 2 | Embodiment 2 | 30 | 10~100 | 40 | 80~170 | OK |
| 3 | Embodiment 3 | 30 | 10~100 | 50 | 90~180 | OK |
| 4 | Embodiment 4 | 40 | 10~100 | 30 | 80~170 | OK |
| 5 | Embodiment 5 | 40 | 10~100 | 40 | 90~180 | OK |
| 6 | Embodiment 6 | 40 | 10~100 | 50 | 100~190 | OK |
| 7 | Embodiment 7 | 50 | 10~100 | 50 | 110~190 | OK |
| 8 | Comparative Example 1 | 50 | 100 | 50 | 200 | NG |

Referring to Table 7, it can be seen that, when the thickness of the interlayer is about 100 μm or less, the folding reliability is high. However, it can be seen that, when the total thickness of the window substrate exceeds 190 μm, the folding reliability was evaluated as NG. The display devices according to inventive embodiments are not limited to the above-described shapes, but may have various shapes.

The window substrate and the display device having the same constructed according to principles of the invention may be employed in various electronic devices. For example, the display device may be applied to televisions, notebook computers, cellular phones, smart phones, smart pads, PMPs, PDAs, navigations, various wearable devices such as smart watches.

According to the inventive concepts, it is possible to provide a window substrate capable of ensuring durability and user's safety, and a display device having the window substrate.

Although certain embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A window substrate for protecting an electronic display device, the window substrate comprising:
   a first substrate having a first material;
   a second substrate having a second material the same as the first substrate; and
   an interlayer having a different material than the first and second substrates, and having opposed sides disposed between the first substrate and the second substrate, with one side of the interlayer being in contact with the first substrate, and the other side of the interlayer being in contact with the second substrate,
   wherein the first substrate has a first thickness, the second substrate has a second thickness, and the interlayer has a third thickness,
   wherein the sum of the first thickness, the second thickness, and the third thickness is about 190 μm or less,
   wherein the electronic display device is a flexible display device and when the window substrate is bent such that the first substrate is disposed toward the outside of the flexible display device and the second substrate is disposed toward the inside of the flexible display device, the first thickness is smaller than the second thickness, and
   wherein the first thickness is about 20 μm to about 40 μm, and the second thickness is about 30 μm to about 50 μm.

2. The window substrate of claim 1, wherein the third thickness is about 100 μm or less.

3. The window substrate of claim 1, wherein the interlayer comprises an optically clear adhesive.

4. The window substrate of claim 1, wherein the window substrate has an impact resistance such that the window substrate is not damaged when a pen of about 5.8 g is vertically dropped from a first height onto one surface of the window substrate, and wherein the first height is about 4 cm or less.

5. The window substrate of claim 1, wherein at least one of the first and second substrates includes a first region extending from one surface thereof to a first depth at which an ion exchange process occurs, and having a first compressive stress.

6. The window substrate of claim 5, wherein the first depth is about 1 μm or more, and the first compressive stress is about 600 MPa to about 1200 MPa.

7. The window substrate of claim 1, wherein the window substrate has a light transmittance of about 90% or more.

8. The window substrate of claim 1, wherein a yellow index variation of the window substrate is about 2.0 or less when the window substrate is exposed to UVB light having a wavelength of 280 nm to 360 nm for about 72 hours.

9. The window substrate of claim 1, wherein an absorption load when an iron ball of about 5.5 g is freely dropped on one surface of the window substrate is about 5% or more of an impact load of the iron ball.

10. The window substrate of claim 1, further comprising a cover layer disposed on the first substrate or the second substrate.

11. The window substrate of claim 10, wherein the cover layer comprises at least one of an anti-reflection layer, an anti-stain layer, or an anti-fingerprint layer.

12. The window substrate of claim 1, wherein at least a portion of the window substrate has flexibility.

13. The window substrate of claim 1, wherein the window substrate is bendable at a radius of curvature of about 1 mm to about 10 mm.

14. The window substrate of claim 1, wherein each of the first thickness and the second thickness is greater than the third thickness.

15. A display device comprising:
    a display panel to display an image on a front surface thereof; and
    a window substrate disposed on the front surface of the display panel,
    wherein the window substrate comprises:
    a first substrate having a first material;
    a second substrate having a second material the same as the first substrate; and
    an interlayer having a different material than the first substrate, and having opposed sides disposed between the first substrate and the second substrate, with one side of the interlayer being in contact with the first substrate, and the other side of the interlayer being in contact with the second substrate,
    wherein the first substrate has a first thickness, the second substrate has a second thickness, and the interlayer has a third thickness,
    wherein the sum of the first thickness, the second thickness, and the third thickness is about 190 μm or less,
    wherein the electronic display device is a flexible display device and when the window substrate is bent such that the first substrate is disposed toward the outside of the flexible display device and the second substrate is disposed toward the inside of the flexible display device, the first thickness is smaller than the second thickness, and
    wherein the first thickness is about 20 μm to about 40 μm, and the second thickness is about 30 μm to about 50 μm.

* * * * *